(12) United States Patent
Lee et al.

(10) Patent No.: US 9,431,374 B2
(45) Date of Patent: Aug. 30, 2016

(54) SEMICONDUCTOR PACKAGE

(71) Applicants: Baik-Woo Lee, Gwangmyeong-si (KR); Seok-Hyun Lee, Hwaseong-si (KR)

(72) Inventors: Baik-Woo Lee, Gwangmyeong-si (KR); Seok-Hyun Lee, Hwaseong-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/595,370

(22) Filed: Jan. 13, 2015

(65) Prior Publication Data

US 2016/0071831 A1 Mar. 10, 2016

(30) Foreign Application Priority Data

Sep. 5, 2014 (KR) ........................ 10-2014-0118918

(51) Int. Cl.
*H01L 25/18* (2006.01)
*H01L 25/065* (2006.01)
*H01L 23/498* (2006.01)
*H01L 23/538* (2006.01)
*H01L 23/13* (2006.01)
*H01L 25/10* (2006.01)
*H01L 23/00* (2006.01)
*H01L 23/31* (2006.01)
*H01L 25/16* (2006.01)

(52) U.S. Cl.
CPC ........... *H01L 25/0657* (2013.01); *H01L 23/13* (2013.01); *H01L 23/3135* (2013.01); *H01L 23/49838* (2013.01); *H01L 23/5389* (2013.01); *H01L 25/105* (2013.01); *H01L 23/3128* (2013.01); *H01L 24/17* (2013.01); *H01L 25/16* (2013.01); *H01L 2224/0401* (2013.01); *H01L 2224/0557* (2013.01); *H01L 2224/06181* (2013.01); *H01L 2224/16145* (2013.01); *H01L 2224/16227* (2013.01); *H01L 2224/17181* (2013.01); *H01L 2224/32225* (2013.01); *H01L 2224/48091* (2013.01); *H01L 2224/48227* (2013.01); *H01L 2224/73204* (2013.01); *H01L 2224/73265* (2013.01); *H01L 2225/06513* (2013.01); *H01L 2225/06517* (2013.01); *H01L 2225/06541* (2013.01); *H01L 2225/06565* (2013.01); *H01L 2225/1023* (2013.01); *H01L 2225/1058* (2013.01); *H01L 2225/1088* (2013.01); *H01L 2225/1094* (2013.01); *H01L 2924/141* (2013.01); *H01L 2924/1426* (2013.01); *H01L 2924/15159* (2013.01); *H01L 2924/15311* (2013.01); *H01L 2924/15331* (2013.01); *H01L 2924/19103* (2013.01); *H01L 2924/19105* (2013.01)

(58) Field of Classification Search
None
See application file for complete search history.

(56) References Cited

U.S. PATENT DOCUMENTS

| | | | |
|---|---|---|---|
| 5,603,017 A | * | 2/1997 | Intrater ............... G06F 9/30167 712/35 |
| 7,242,081 B1 | | 7/2007 | Lee |
| 8,344,493 B2 | | 1/2013 | West et al. |

(Continued)

*Primary Examiner* — Johannes P Mondt
(74) *Attorney, Agent, or Firm* — Lee & Morse, P.C.

(57) ABSTRACT

A semiconductor device includes a substrate having a first part and a second part, the first and second parts being continuous with each other and at different height levels, a first semiconductor chip overlapping the first and second parts of the substrate, an electrical interconnection structure connecting the first part of the substrate and the first semiconductor chip, a distance between the first part of the substrate and the first semiconductor chip being shorter than a distance between the second part of the substrate and the first semiconductor chip, and at least one electronic component in a space between the second part of the substrate and the first semiconductor chip.

19 Claims, 26 Drawing Sheets

(56) References Cited

U.S. PATENT DOCUMENTS

| | | |
|---|---|---|
| 8,624,364 B2 | 1/2014 | Chow et al. |
| 2004/0195668 A1* | 10/2004 | Sawamoto .......... H01L 23/3114 257/686 |
| 2007/0295982 A1* | 12/2007 | Ryu ................. G06K 19/07732 257/99 |
| 2009/0032927 A1 | 2/2009 | Kim et al. |
| 2011/0278741 A1* | 11/2011 | Chua ..................... H01L 21/561 257/777 |
| 2013/0181359 A1 | 7/2013 | Wu |

* cited by examiner

SEMICONDUCTOR PACKAGE

CROSS-REFERENCE TO RELATED APPLICATION

Korean Patent Application No. 10-2014-0118918, filed on Sep. 5, 2014, in the Korean Intellectual Property Office, and entitled: "Semiconductor Package," is incorporated by reference herein in its entirety.

BACKGROUND

1. Field

Embodiments relate to a semiconductor package including a plurality of semiconductor chip structures and embedded peripheral component structures, and an electronic device, a medical device, and a medical system employing the same.

2. Description of the Related Art

Recently, though a portable electronic device has been minimized for convenience of carrying or designed with a gradually smaller thickness even in a same plane size, high performance and various functionalities are still required. Various studies on the portable electronic device, in which a plurality of semiconductor chips having a number of functions are included in a single semiconductor package, are being conducted in response to a trend of the portable electronic device.

SUMMARY

In accordance with an embodiment, there is provided a semiconductor device including a substrate having a first part and a second part, the first and second parts being continuous with each other and at different height levels, a first semiconductor chip overlapping the first and second parts of the substrate, an electrical interconnection structure connecting the first part of the substrate and the first semiconductor chip, a distance between the first part of the substrate and the first semiconductor chip being shorter than a distance between the second part of the substrate and the first semiconductor chip, and at least one electronic component in a space between the second part of the substrate and the first semiconductor chip.

A bottom surface of the first semiconductor chip may overlap a top of the at least one electronic component.

The first semiconductor chip may extend beyond the at least one electronic component along a direction oriented from the first part of the substrate toward the second part of the substrate.

Each of the substrate and the first semiconductor chip may completely overlap the at least one electronic component.

A distance between a bottom surface of the first semiconductor chip and a top surface of the second part of the substrate along a normal direction to the substrate may be larger than a height of the at least one electronic component as measured from an upper surface of the substrate.

The at least one electronic component may be electrically connected to the substrate.

The at least one electronic component may be a passive electronic component.

The at least one electronic component may be a driver chip or a controller chip.

The semiconductor device may further include additional semiconductor chips stacked on the first semiconductor chip and interconnected via through-silicon-vias (TSVs).

The first semiconductor chip and the additional semiconductor chips may be memory chips interconnected via TSVs.

The additional semiconductor chips may be three memory chips interconnected via TSVs, the at least three memory chips overlapping each other and the first and second parts of the substrate.

The interconnection structure may be a flip-chip interconnection.

The semiconductor device may further include a mold layer between the second part of the substrate and the first semiconductor chip, the at least one electronic component being embedded in the mold layer between the second part of the substrate and the first semiconductor chip.

The part of the substrate may be connected to a lower substrate with a lower semiconductor chip, the lower substrate and the at least one electronic component being on opposite surfaces of the second part of the substrate.

The first part of the substrate may overlap the lower semiconductor chip, and the first semiconductor chip may be substantially longer than the lower semiconductor chip along a direction parallel to a top surface of the substrate.

The lower semiconductor chip may be between two electronic components along the direction parallel to the top surface of the substrate, the lower semiconductor chip being spaced apart from each of the two electronic components, and the first semiconductor chip overlapping the two electronic components.

A distance between a lower surface of the first semiconductor chip and an upper surface of the lower substrate along a normal direction to the substrate may be constant.

The semiconductor device may further include an interposer electrically connecting between the first semiconductor chip and the substrate.

The interposer may overlap a top of the at least one electronic component, the interposer extending beyond the at least one electronic component along a direction oriented from the first part of the substrate toward the second part of the substrate.

The first part of the substrate may be connected to the second part of the substrate by an inclined part, the second and inclined parts surrounding the first part, and the space between the second part of the substrate and the first semiconductor chip may surround the first part of the substrate.

The space surrounding the first part of the substrate may have a constant height, a plurality of electronic components spaced apart from each other being positioned in the space around the first part.

In accordance with another embodiment, there is provided a semiconductor package including a lower semiconductor chip on a lower substrate, an upper substrate over the lower substrate, the upper substrate having a first part and a second part, the first and second parts being continuous with each other and at different height levels, an upper semiconductor chip overlapping the first and second parts of the upper substrate, a first electrical interconnection structure connecting the first part of the upper substrate and the upper semiconductor chip, a distance between the first part of the upper substrate and the upper semiconductor chip being shorter than a distance between the second part of the upper substrate and the upper semiconductor chip, a second electrical interconnection structure connecting the second part of the upper substrate to the lower substrate, and at least one electronic component in a space between the second part of the upper substrate and the upper semiconductor chip.

The lower substrate and the at least one electronic component may be on opposite surfaces of the second part of the upper substrate.

In accordance with another embodiment, there is provided a semiconductor device including a first substrate having a first part and a second part, the first and second parts being continuous with each other and at different height levels, a second substrate completely overlapping the first substrate, an interconnection structure connecting the first part of the first substrate and the second substrate, a distance between the first part of the first substrate and the second substrate being shorter than a distance between the second part of the first substrate and the second substrate, and at least one electronic component in a space between the second part of the first substrate and the second substrate.

The semiconductor device may further include a semiconductor chip on the second substrate, the second substrate being an interposer connecting between the semiconductor chip and the first substrate.

In accordance with another embodiment, there is provided a semiconductor package including a lower semiconductor chip on a lower substrate, an upper substrate over the lower substrate, the upper substrate having a first part and a second part, the first and second parts being continuous with each other and at different height levels, an upper semiconductor chip overlapping the first and second parts of the upper substrate, a first electrical interconnection structure connecting the first part of the upper substrate and the upper semiconductor chip, a distance between the first part of the upper substrate and the upper semiconductor chip being shorter than a distance between the second part of the upper substrate and the upper semiconductor chip, a second electrical interconnection structure connecting the second part of the upper substrate to the lower substrate, the upper semiconductor chip overlapping at least part of the second electrical connection, and a space between an upper surface of the second part of the upper substrate and a bottom surface of the upper semiconductor chip.

The space may have a constant height.

The semiconductor package may further include an electronic component in the space, the electronic component being electrically connected to the upper substrate.

In accordance with another embodiment, there is provided a semiconductor package including a lower semiconductor chip on a lower substrate, an upper substrate over the lower substrate, the upper substrate having a first part and a second part, the first and second parts being continuous with each other and at different height levels, first through fourth semiconductor chips interconnected via through-silicon-vias (TSVs) and sequentially stacked on the upper substrate, each of the first through fourth semiconductor chips overlapping the first and second parts of the upper substrate, a first electrical interconnection structure connecting the first part of the upper substrate and the first semiconductor chip, a distance between the first part of the upper substrate and the first semiconductor chip being shorter than a distance between the second part of the upper substrate and the first semiconductor chip, a second electrical interconnection structure connecting the second part of the upper substrate to the lower substrate, at least one electronic component in a space between the second part of the upper substrate and the first semiconductor chip, a first mold layer on the upper substrate and covering the at least one electronic component, an upper surface of the first mold layer being level with an upper surface of the upper substrate, and a second mold layer on the first mold layer, the second mold layer surrounding each of the first through fourth semiconductor chips.

The first part of the upper substrate may be a central part overlapping the first electrical interconnection structure and the TSVs, and the space between the second part of the upper substrate and the first semiconductor chip surrounds the central part, a plurality of electronic components spaced apart from each other being positioned around the central part.

The first and second mold layers include a same material and are integral with each other.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1:
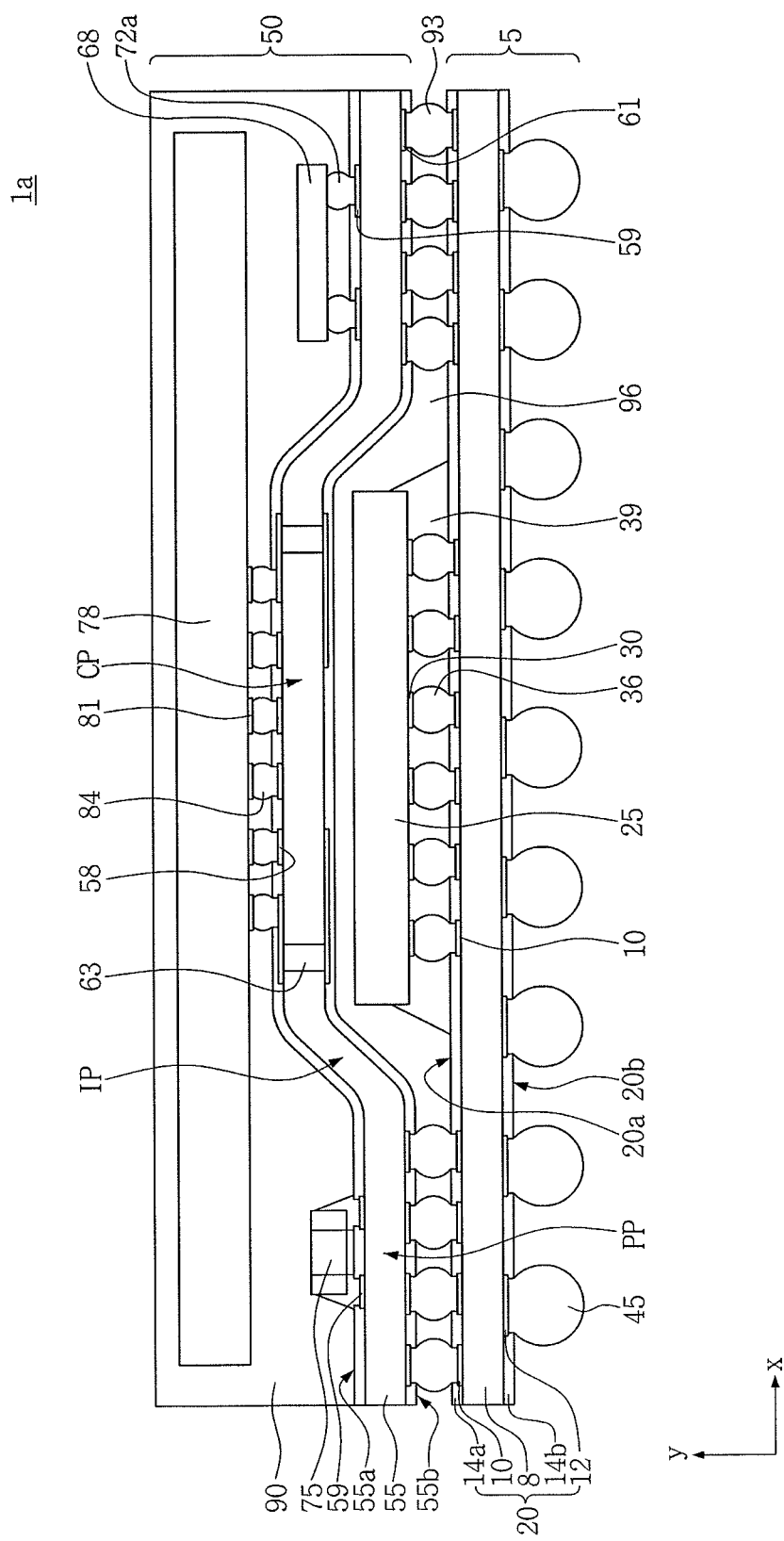
FIG. 1 illustrates a cross-sectional view of a semiconductor package in accordance with an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

Embodiments are described herein with reference to cross-sectional views, plan views, and/or block diagrams that are schematic illustrations of idealized embodiments. As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. Therefore, regions illustrated in the drawings are schematic in nature, and their shapes are not intended to limit.

Terms such as "top," "bottom," "upper," "lower," "above," "below," and the like are used herein to describe the relative positions of elements or features. It will be understood that such descriptions are intended to encompass different orientations in use or operation in addition to orientations depicted in the drawings. For example, when an upper part of a drawing is referred to as a "top" and a lower part of a drawing as a "bottom" for the sake of convenience, in practice, the "top" may also be called a "bottom" and the "bottom" a "top" without departing from the teachings.

Furthermore, throughout this disclosure, directional terms such as "upper," "intermediate," "lower," and the like may be used herein to describe the relationship of one element or feature with another, and embodiments should not be limited by these terms. Accordingly, these terms such as "upper," "intermediate," "lower," and the like may be replaced by other terms such as "first," "second," "third," and the like to describe the elements and features.

It will be understood that, although the terms "first," "second," etc. may be used herein to describe various elements, these elements should not be limited by these terms. These terms are only used to distinguish one element from another. Thus, a first element could be termed a second element without departing from the teachings of the embodiments.

The terminology used herein to describe embodiments is not intended to limit. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
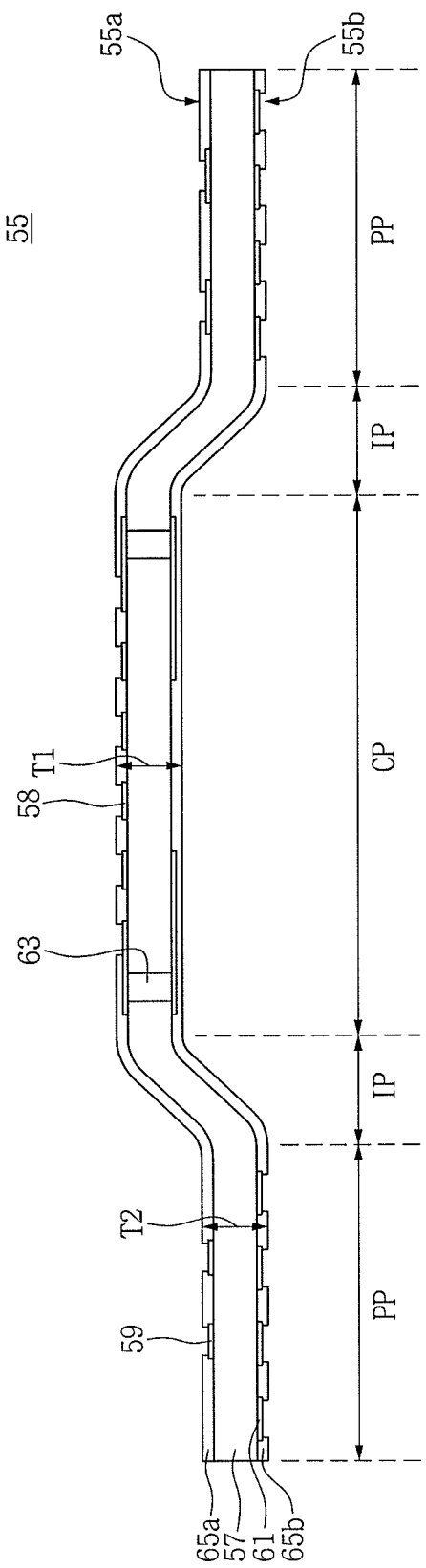
FIG. 2 illustrates a cross-sectional view of an upper substrate of a semiconductor package in accordance with an embodiment.
Figure 3A:
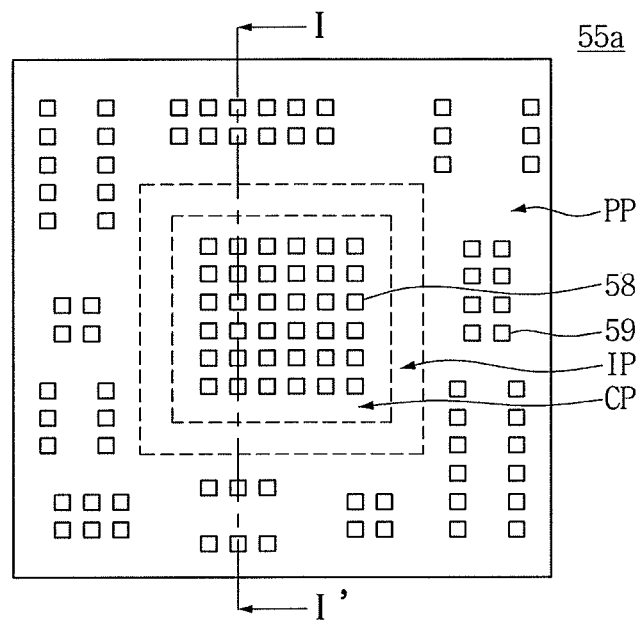
FIG. 3A illustrates a top view of an upper surface of an upper substrate of a semiconductor package in accordance with an embodiment.
Figure 3B:
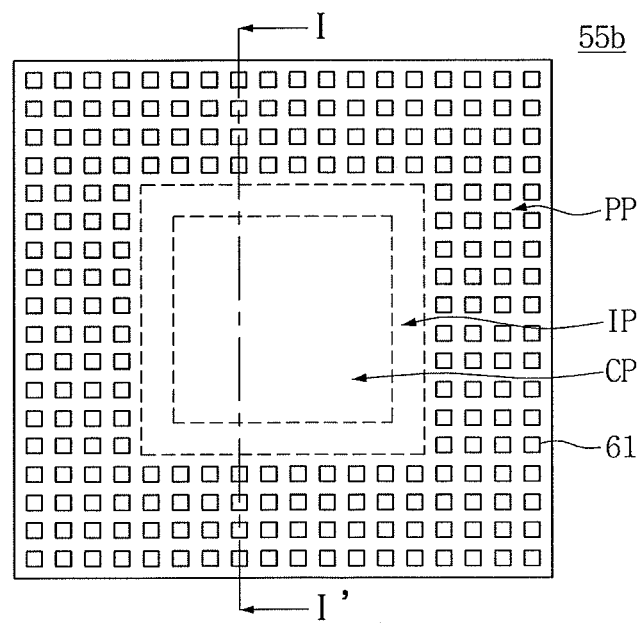
FIG. 3B illustrates a bottom view of a lower surface of an upper substrate a semiconductor package in accordance with an embodiment.
Figure 4:
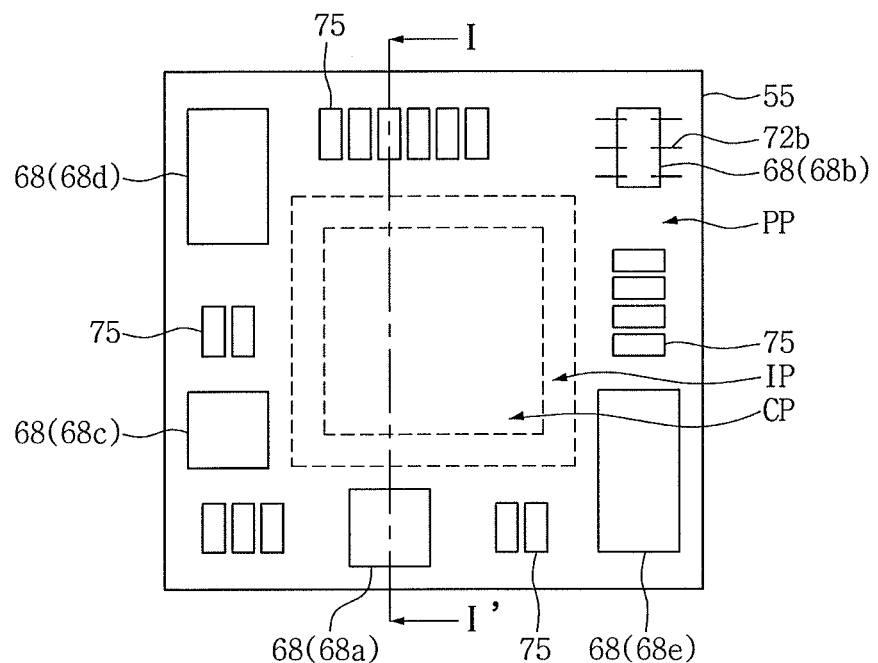
FIG. 4 illustrates a top view of an upper substrate and peripheral component structures of a semiconductor package in accordance with an embodiment.

A semiconductor package in accordance with an embodiment will be described with reference to FIGS. 1, 2, 3A, 3B, and 4. FIG. 1 illustrates a cross-sectional view of a semiconductor package in accordance with an embodiment. FIG. 2 illustrates a cross-sectional view of an upper substrate of the semiconductor package in FIG. 1. FIG. 3A illustrates a plane, top view of an upper surface of the upper substrate of FIG. 2. FIG. 3B illustrates a plane, bottom view of a lower surface of the upper substrate of FIG. 2. FIG. 4 illustrates a schematic top view of the upper substrate and peripheral component structures of the semiconductor package in FIG. 1. FIGS. 1 and 2 show cross-sections taken along lines I-I' of FIGS. 3A, 3B, and 4.

Referring to FIGS. 1, 2, 3A, 3B, and 4, a semiconductor package lain accordance with an embodiment may include a lower package 5 including a lower semiconductor chip structure 25, an upper package 50 which is disposed on the lower package 5 and includes an upper semiconductor chip structure 78 and peripheral component structures 68 and 75, and a plurality of package interconnection structures 93.

The lower package 5 may include a lower substrate 20 having an upper surface 20a and a lower surface 20b, the lower semiconductor chip structure 25 disposed on the upper surface 20a of the lower substrate 20, lower chip interconnection structures 36 interposed between the lower semiconductor chip structure 25 and the upper surface 20a of the lower substrate 20, a lower underfill material 39 which fills between the lower semiconductor chip structure 25 and the lower substrate 20 and surrounds side surfaces of the lower chip interconnection structures 36, and lower interconnection structures 45 disposed on the lower surface 20b of the lower substrate 20.

The lower substrate 20 may be a printed circuit board. For example, the lower substrate 20 may include a base 8, upper pads 10, lower pads 12, an upper surface layer 14a, and a lower surface layer 14b. The upper pads 10 of the lower substrate 20 may be disposed on the upper surface 20a of the lower substrate 20. The upper surface layer 14a of the lower substrate 20 may be disposed on the upper surface 20a of the lower substrate 20 and may expose the upper pads 10.

The lower pads 12 of the lower substrate 20 may be disposed on the lower surface 20b of the lower substrate 20. The lower surface layer 14b of the lower substrate 20 may be disposed on the lower surface 20b of the lower substrate 20 and may expose the lower pads 12. Each of the upper and lower surface layers 14a and 14b may be formed of a solder resist material.

The lower semiconductor chip structure 25 may be mounted on the upper surface 20a of the lower substrate 20 in a flip chip structure, i.e., the lower semiconductor chip structure 25 may be electrically connected to the lower substrate 20 via solder bumps. The lower semiconductor chip structure 25 may include lower chip pads 30 disposed on a surface facing the lower substrate 20.

The lower chip interconnection structures 36 may electrically connect the lower chip pads 30 of the lower semiconductor chip structure 25 to the upper pads 10 of the upper surface 20a of the lower substrate 20. Each of the lower chip interconnection structures 36 may include a bump and/or a solder ball structure.

The lower connection structures 45 may be disposed on the lower pads 12 of the lower surface 20b of the lower substrate 20. Each of the lower connection structures 45 may include a solder ball structure.

For example, the lower semiconductor chip structure 25 may include a logic semiconductor chip. In another example, the lower semiconductor chip structure 25 may include an application processor semiconductor chip.

The upper package 50 may include an upper substrate 55 having an upper surface 55a and a lower surface 55b, the peripheral component structures 68 and 75 mounted on the upper surface 55a of the upper substrate 55, the upper semiconductor chip structure 78 disposed on the upper surface 55a of the upper substrate 55, upper chip interconnection structures 84 which electrically connect the upper semiconductor chip structure 78 to the upper substrate 55, and a molding layer 90 disposed on the upper surface 55a of the upper substrate 55. The lower surface 55b of the upper substrate 55 may be facing the lower package 5.

The upper substrate 55 may include a first part CP, a second part PP, and a third part IP interposed between the first part CP and the second part PP. The third part IP of the upper substrate 55 may be an inclined part, e.g., the third part IP may be inclined at an oblique angle with respect to the first part CP. The lower semiconductor chip structure 25 may be disposed under the first part CP of the upper substrate 55, e.g., the lower semiconductor chip structure 25 and the first part CP of the upper substrate 55 may be aligned an overlap each other.

In an embodiment, as illustrated in FIG. 3A, the second part PP of the upper substrate 55 may be disposed to surround, e.g., completely surround, the first part CP. The first part CP may be a central part of the upper substrate 55, and the second part PP may be a peripheral part of the upper substrate 55 that surrounds the first part CP. The second part PP may extend from the third part IP to an edge of the upper substrate 55.

The first part CP and the second part PP may be located at different height levels along the y-axis, as illustrated in FIG. 1. The third part IP may be a part connecting the first part CP to the second part PP, and may be inclined as a result of the height difference between the levels of the first part CP and the second part PP. A distance along the y-axis between a bottom of the first part CP of the upper substrate 55 and a bottom of the lower substrate 20 may be longer than a distance along the y-axis between a bottom of the second part PP of the upper substrate 55 and the bottom of the lower substrate 20. In other words, a distance between the second part PP of the upper substrate 55 to the lower substrate 20 may be smaller than a distance between the first part CP of the upper substrate 55 and the lower substrate 20.

A thickness T1 of the first part CP of the upper substrate 55 may be the same as a thickness T2 of the second part PP along the y-axis (FIG. 2). Therefore, a distance between an upper surface of the second part PP of the upper substrate 55 and the lower substrate 20 may be smaller than a distance between an upper surface of the first part CP of the upper substrate 55 and the lower substrate 20.

The upper substrate 55 may be a printed circuit board which does not include glass fibers. The upper substrate 55 may be formed of a material capable of being modified by heat and pressure. For example, the upper substrate 55 may be formed of a material, of which a shape can be modified, using a stamping process which modifies a shape by heating and applying pressure. For example, formation of the upper substrate 55 may include preparing a metal mold with a protruding center, disposing a flat printed circuit board on the metal mold, applying pressure to the printed circuit board at a temperature higher than a room temperature in a direction of the metal mold, and modifying the printed circuit board to a shape corresponding to the shape of an upper surface of the metal mold, i.e., a shape with a protruding center.

The upper substrate 55 may include a base 57, first pads 58, second pads 59, internal wiring structures 63, a first surface layer 65a, and a second surface layer 65b. The first pads 58 of the upper substrate 55 may be disposed on an upper surface 55a of the first part CP of the upper substrate 55. The second pads 59 of the upper substrate 55 may be disposed on the upper surface 55a of the second part PP of the upper substrate 55. The first surface layer 65a of the upper substrate 55 may be disposed on the upper surface 55a of the upper substrate 55 and have openings which expose the first pads 58 and the second pads 59.

Third pads 61 of the upper substrate 55 may be disposed on a lower surface 55b of the second part PP of the upper substrate 55. The second surface layer 65b of the upper substrate 55 may be disposed on the lower surface 55b of the upper substrate 55 to have openings which expose the third pads 61.

The internal wiring structures 63 of the upper substrate 55 may electrically connect the first and second pads 58 and 59 of the upper substrate 55 to the third pads 61 of the upper substrate 55.

The base 57 of the upper substrate 55 may be formed of a material capable of being modified by heat and pressure, e.g., polyimide, or the like. The first to third pads 58, 59, and 61 and the internal wiring structures 63 may be formed of a metal material, e.g., copper or the like. The first and second surface layers 65a and 65b may be formed of a solder resist material.

The upper semiconductor chip structure 78 may be mounted on the upper substrate 55. The upper semiconductor chip structure 78 may overlap the first part CP, the third parts IP, and the second parts PP of the upper substrate 55. For example, the upper semiconductor chip structure 78 may continuously overlap the first part CP, the third part IP, and at least a portion of the second part PP of the upper substrate 55

The upper semiconductor chip structure 78 may be disposed on the upper substrate 55, and may be electrically connected to the first part CP of the upper substrate 55. The upper semiconductor chip structure 78 may be mounted on the upper surface 55a of the first part CP of the upper substrate 55. The upper semiconductor chip structure 78 may be mounted on the upper surface 55a of the first part CP of the upper substrate 55 in a flip chip structure.

Use of the flip chip structure between the upper semiconductor chip structure 78 and the first part CP of the upper substrate 55 increases the amount of space on the second part PP of the upper substrate 55 that is available for the peripheral component structures 68 and 75. That is, if the upper semiconductor chip structure 78 and the upper substrate 55 were to be connected by a wire structure, the wire structure would have to be connected to the upper surface 55a of the second part PP of the upper substrate 55, thereby eliminating the space available for the peripheral component structures 68 and 75. Further, when the upper semiconductor chip structure 78 is long and overlaps the second part PP of the upper substrate 55, there is no space on the upper substrate 55 for wire connection.

The upper semiconductor chip structure 78 may include upper chip pads 81 disposed on a surface facing the upper substrate 55. The upper chip interconnection structures 84 may electrically connect the upper chip pads 81 of the upper semiconductor chip structure 78 to the first pads 58 of the upper surface 55a of the first part CP of the upper substrate 55. Each of the upper chip interconnection structures 84 may be interposed between respective upper chip pads 81 and first pads 58. Each of the upper chip interconnection structures 84 may include a bump and/or a solder ball structure.

The peripheral component structures 68 and 75 may be mounted on the upper surface 55a of the second part PP of the upper substrate 55. The peripheral component structures 68 and 75 may include a plurality of peripheral components mounted on the upper surface 55a of the second part PP of the upper substrate 55.

In an embodiment, the peripheral component structures 68 and 75 are electrically connected to the upper substrate 55, and include parts which improve functionality of the semiconductor package 1a, e.g., buffer chips, driver chips, power management ICs, analog devices, communication devices, controller chips, and/or passive devices. For example, the communication device may be a wireless communication chip. For example, the passive device may be a passive device such as a capacitor, etc.

In an embodiment, the peripheral component structures 68 and 75 may include a plurality of peripheral components of different sizes. For example, the peripheral component structures 68 and 75 may include an active device 68 and a passive device 75. For example, the active device 68 may include different types of devices, e.g., first through fifth peripheral components 68a, 68b, 68c, 68d, and 68e.

For example, referring to FIG. 4, the first peripheral component 68a may be mounted in a flip chip structure on the second part PP of the upper substrate 55 using at least one solder ball 72a (FIG. 1) connected to a corresponding second pad 59 (FIGS. 1 and 3A). In another example, as illustrated in FIG. 4, a second peripheral component 68b may be mounted in a wire bonding structure on the second part PP of the upper substrate 55 using a bonding wire 72b.

In an embodiment, the upper semiconductor chip structure 78 extends along the upper substrate 55 to overlap the, e.g., entire, peripheral component structures 68 and 75 on the second part PP of the upper substrate 55. For example, the upper semiconductor chip structure 78 may extend beyond the peripheral component structures 68 and 75 along the x-axis. An increased length of the upper semiconductor chip structure 78 increases memory capacity thereof.

A height of each of the peripheral component structures 68 and 75 along the y-axis, i.e., a portion of each of the peripheral component structures 68 and 75 above the upper surface 55a of the upper substrate 55, may be smaller than a distance between a bottom of the upper semiconductor chip structure 78 and the upper surface 55a of the upper substrate 55 on the second part PP of the upper substrate 55. In other words, each of the peripheral component structures 68 and 75 may fit within a space defined between a bottom of the upper semiconductor chip structure 78 and the upper surface 55a of the upper substrate 55 in the second part PP of the upper substrate 55.

The molding layer 90 may be disposed on the upper surface 55a of the upper substrate 55. The molding layer 90 may cover the peripheral component structures 68 and 75 and surround the upper semiconductor chip structure 78 mounted on the upper substrate 55. For example, the molding layer 90 may surround the upper semiconductor chip structure 78 and fill between the upper semiconductor chip structure 78 and the upper substrate 55. The molding layer 90 may surround side surfaces of the upper chip interconnection structures 84. The molding layer 90 may be formed of, e.g., an epoxy molded underfill material.

The plurality of package interconnection structures 93 may electrically connect the upper package 50 to the lower package 5. The plurality of package interconnection structures 93 may be interposed between the third pads 61 of the second part PP of the upper substrate 55 and the upper pads 10 of the lower substrate 20. Each of the plurality of package interconnection structures 93 may be formed in a bump and/or a solder ball structure. The semiconductor package 1a may include an empty space 96 between the lower package 5 and the upper package 50.

According to an embodiment, a distance between the second part PP of the upper substrate 55 and the lower substrate 20 may be smaller than a distance between the first part CP of the upper substrate 55 and the lower substrate 20. Thus, as the distance between the second part PP of the upper substrate 55 and the lower substrate 20 becomes smaller, the plurality of package interconnection structures 93 may have a smaller size, e.g., a smaller diameter along the y-axis. Accordingly, the package interconnection structures 93 may be disposed more compactly and closely to each other between the second part PP of the upper substrate 55 and the lower substrate 20. Therefore, a greater number of the plurality of package interconnection structures 93 may be disposed between the second part PP of the upper substrate 55 and the lower substrate 20.

The plurality of package interconnection structures 93 may include input/output pins which electrically connect the upper package 50 to the lower package 5. Since a greater number of the plurality of package interconnection structures 93 may be disposed, a data transfer rate between the upper semiconductor chip structure 78 of the upper package 50 and the lower semiconductor chip structure 25 of the lower package 5 may be improved. For example, when the upper semiconductor chip structure 78 is a memory semiconductor chip, e.g., a DRAM or the like, and the lower semiconductor chip structure 25, e.g., a processor semiconductor chip, since the number of the plurality of package interconnection structures 93 are increased, a data transfer rate between the memory semiconductor chip and the processor semiconductor chip may be improved.

According to an embodiment, since the peripheral component structures 68 and 75 are mounted on the second part PP of the upper substrate 55 in a space between the upper semiconductor chip 78 and the upper substrate 55, e.g., rather than outside the semiconductor package 1a or in a non-overlapping relationship with the upper semiconductor chip 78, a thickness of the semiconductor package 1a along the y-axis and a width of the semiconductor chip 78 along the x-axis may be maintained, i.e., may not be increased, while the semiconductor package 1a includes, i.e., is integrated with, the peripheral component structures 68 and 75. Therefore, the semiconductor package 1a may include the peripheral component structures 68 and 75 in a compact structure with a plurality of semiconductor chip structures 25 and 78 without increasing the overall thickness and width thereof. Further, the semiconductor package 1a may have improved signal transfer due to the proximity between the peripheral component structures 68 and 75 and the semiconductor chip structures 25 and 78, e.g., as compared to component structures outside the semiconductor package and/or on a separate board.

Figure 5:
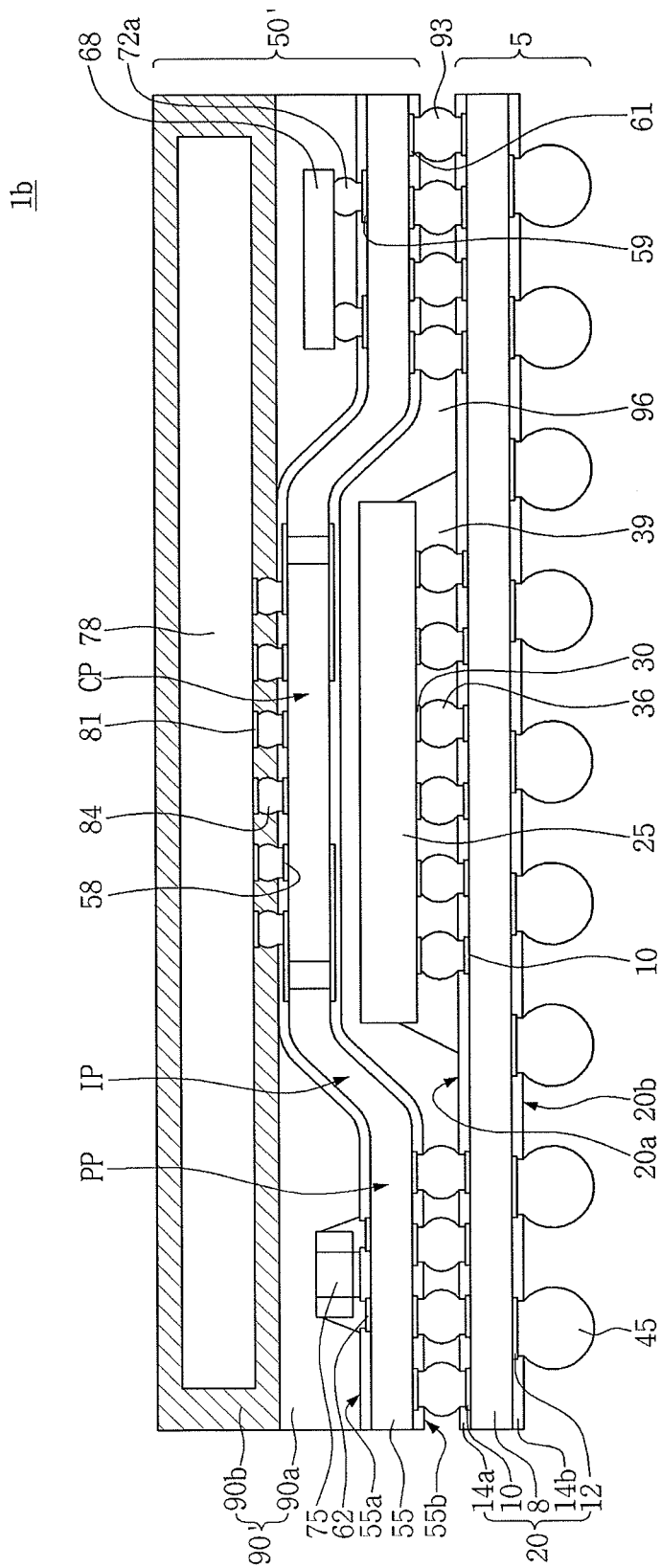
FIG. 5 illustrates a cross-sectional view of a semiconductor package in accordance with another embodiment.

A semiconductor package in accordance with another embodiment will be described with reference to FIG. 5. FIG. 5 is a cross-sectional view of the semiconductor package in accordance with the other embodiment.

Referring to FIG. 5, a semiconductor package 1b in accordance with an embodiment may include the lower package 5, an upper package 50' disposed on the lower package 5, and the package interconnection structures 93 disposed between the upper package 50' and the lower package 5.

The lower package 5 may include the lower substrate 20, the lower semiconductor chip structure 25 mounted on the upper surface 20a of the lower substrate 20, and the lower connection structures 45 disposed on the lower surface 20b of the lower substrate 20, which are the same as those described in FIG. 1. The upper package 50' may include the upper substrate 55, the upper semiconductor chip structure 78 mounted on the first part CP of the upper substrate 55, and the peripheral component structures 68 and 75 mounted on the second parts PP of the upper substrate 55, which are the same as those described in FIG. 1.

As illustrated in FIG. 5, the upper package 50' may include a molding layer 90' which is disposed on the upper substrate 55 and covers the upper semiconductor chip structure 78 and the peripheral component structures 68 and 75. The molding layer 90' may include a lower molding layer 90a and an upper molding layer 90b.

The lower molding layer 90a is disposed on upper surfaces of the second part PP and the third part IP of the upper substrate 55, and covers the peripheral component structures 68 and 75. For example, the lower molding layer 90a may completely cover the peripheral component structures 68 and 75, such that an upper surface of the lower molding layer 90a is substantially level with an upper surface of the first part CP of the upper substrate 55.

The upper molding layer 90b may be disposed on the first part CP of the upper substrate 55 and on the lower molding layer 90a, and surrounds the upper semiconductor chip structure 78. For example, the upper molding layer 90b may surround all exposed surfaces of the upper semiconductor chip structure 78.

The package interconnection structures 93, as described in FIG. 1, may be disposed between the upper pads 10 of the lower substrate 20 and the third pads 61 of the upper substrate 55. The package interconnection structures 93, as described in FIG. 1, may be disposed between the lower package 5 and the upper package 50', and may electrically connect the lower package 5 to the upper package 50'.

Figure 6:
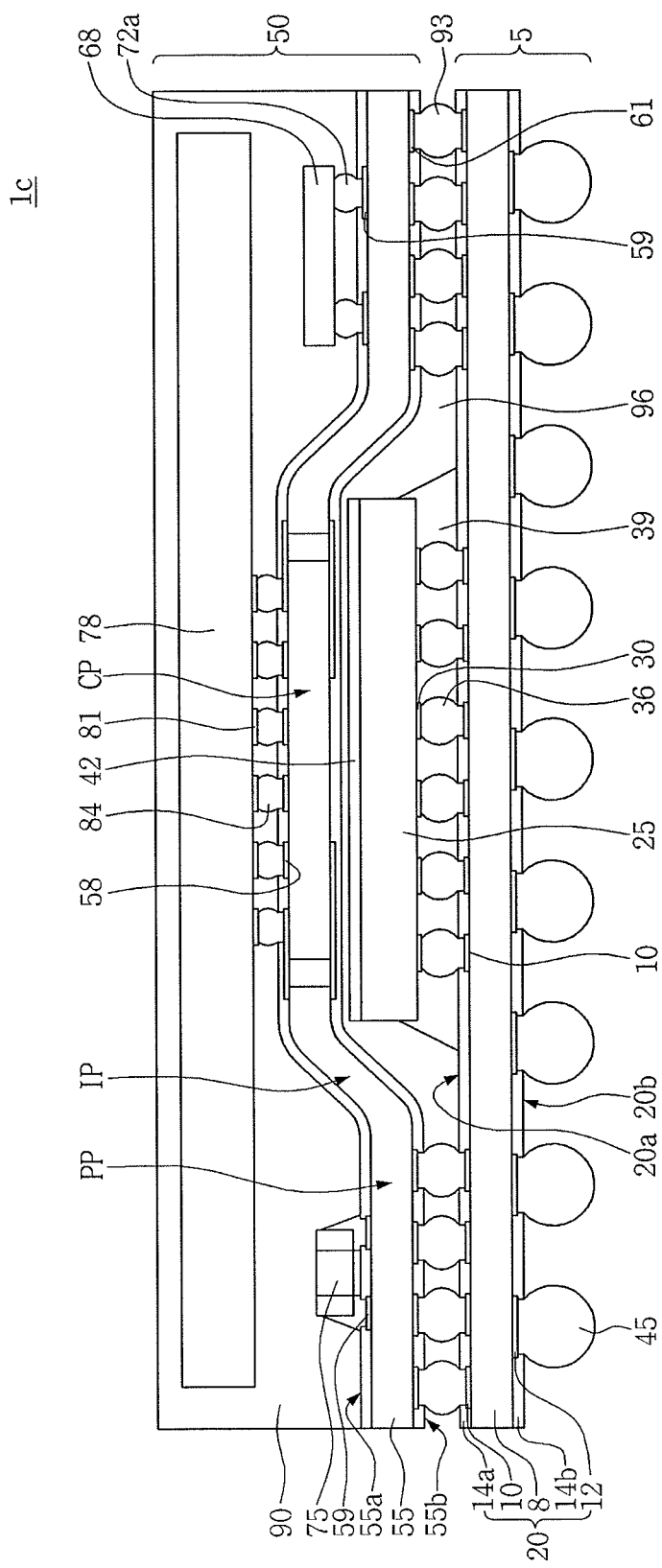
FIG. 6 illustrates a cross-sectional view of a semiconductor package in accordance with another embodiment.

According to an embodiment, a semiconductor package including a heat dissipation member may be provided. The semiconductor package including the heat dissipation member will be described with reference to FIG. 6. FIG. 6 is a cross-sectional view showing the semiconductor package in accordance with an embodiment.

Referring to FIG. 6, the semiconductor package 1c in accordance with an embodiment may include the lower package 5, the upper package 50, and the package interconnection structures 93 disposed between the lower package 5 and the upper package 50, which are the same as those described in FIG. 1. The semiconductor package 1c may further include a heat dissipation member 42 disposed on an upper surface of the lower semiconductor chip structure 25 of the lower package 5.

The heat dissipation member 42 may be formed of a thermal interface material (TIM). The heat dissipation member 42 may emit and dissipate heat generated inside the lower semiconductor chip structure 25.

Figure 7:
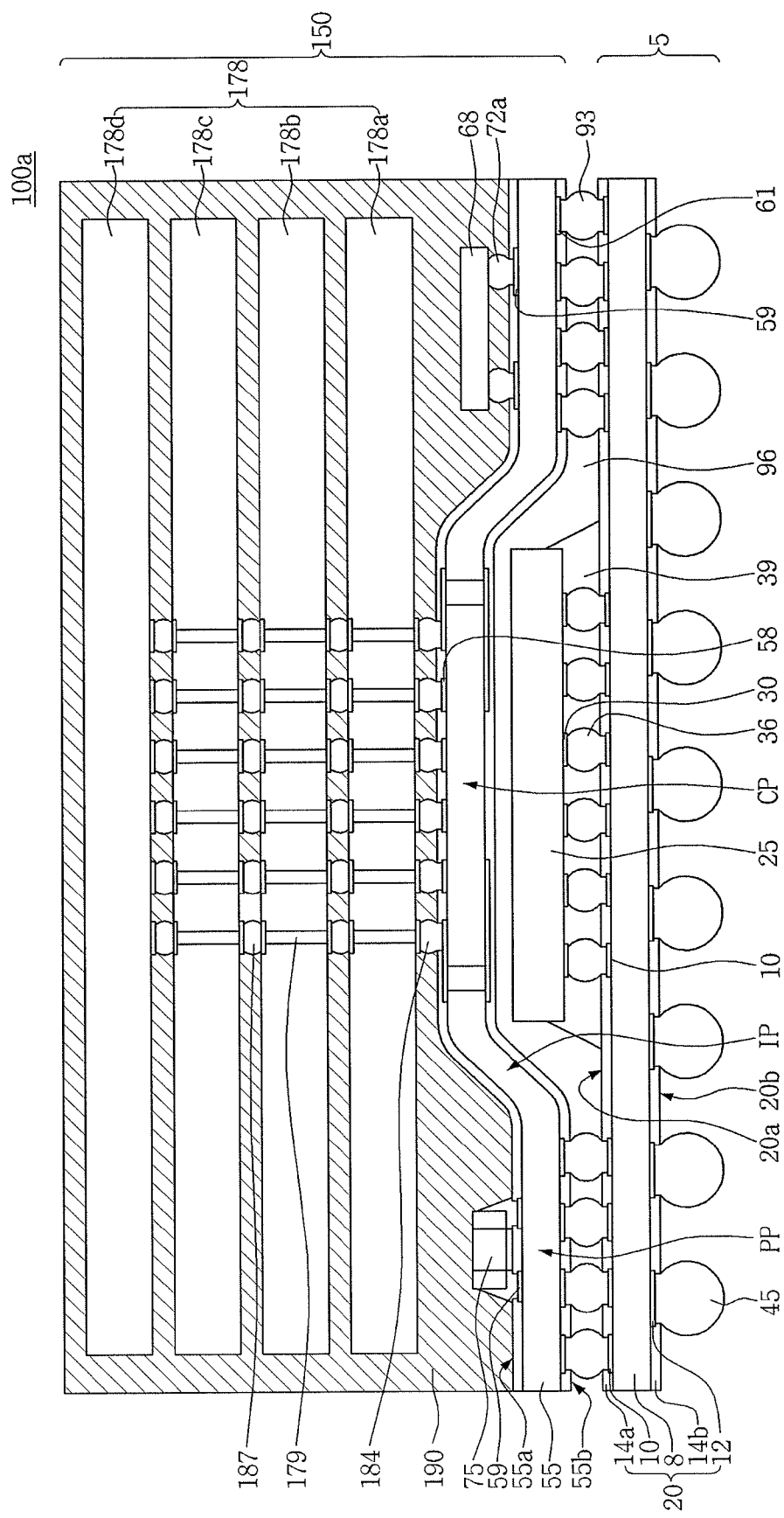
FIG. 7 illustrates a cross-sectional view of a semiconductor package in accordance with another embodiment.

A semiconductor package 100a in accordance with an embodiment will be described with reference to FIG. 7. FIG. 7 is a cross-sectional view of the semiconductor package 100a in accordance with an embodiment.

Referring to FIG. 7, the semiconductor package 100a in accordance with an embodiment may include the lower package 5, an upper package 150 disposed on the lower package 5, and the package interconnection structures 93 which are disposed between the upper package 150 and the lower package 5 and electrically connect the upper package 150 to the lower package 5. The lower package 5 may include the lower substrate 20, the lower semiconductor chip structure 25 mounted on the upper surface 20a of the lower substrate 20, and the lower connection structures 45 disposed on the lower surface 20b of the lower substrate 20, which are the same as those described in FIG. 1.

The upper package 150 may include the upper substrate 55 having the first part CP, the second part PP, and the third part IP disposed between the first part CP and the second part PP, and the peripheral component structures 68 and 75 mounted on the second part PP of the upper substrate 55, which are the same as those described in FIGS. 1 to 4. The upper package 150 may further include an upper semiconductor chip structure 178 mounted on the first part CP of the upper substrate 55, and a molding layer 190 which covers the upper surface 55a of the upper substrate 55, the upper semiconductor chip structure 178, and the peripheral component structures 68 and 75.

As illustrated in FIG. 7, the upper semiconductor chip structure 178 may include a plurality of upper semiconductor chips, e.g., upper semiconductor chips 178a, 178b, 178c and 178d, and upper interconnection structures 187. For example, the upper semiconductor chips may include a first upper semiconductor chip 178a, a second upper semiconductor chip 178b, a third upper semiconductor chip 178c, and a fourth upper semiconductor chip 178d, which are sequentially stacked. The first to third upper semiconductor chips 178a to 178c may include through-electrodes 179 passing through the first to third upper semiconductor chips 178a to 178c. The upper chip interconnection structures 187 may electrically connect the upper semiconductor chips 178a, 178b, 178c and 178d. The upper chip interconnection structures 187 may be disposed between the upper semiconductor chips 178a, 178b, 178c and 178d. The upper chip interconnection structures 187 may be electrically connected to the through-electrodes 179.

The upper semiconductor chip structure 178 may be mounted on the first part CP of the upper substrate 55 in a flip chip structure. The upper semiconductor chip structure 178 may be electrically connected to the first part CP of the upper substrate 55 by upper chip interconnection structures 184 interposed between the upper semiconductor chip structure 178 and the first part CP of the upper substrate 55.

The molding layer 190 may be disposed on the upper surface 55a of the upper substrate 55. The molding layer 190 may cover the peripheral component structures 68 and 75, which are positioned in a space between the upper substrate 55 and the first upper semiconductor chip 178a, and nay surround the upper semiconductor chip structure 178 mounted on the upper substrate 55. The molding layer 190 may fill between the upper semiconductor chips 178a, 178b, 178c, and 178d.

Figure 8:
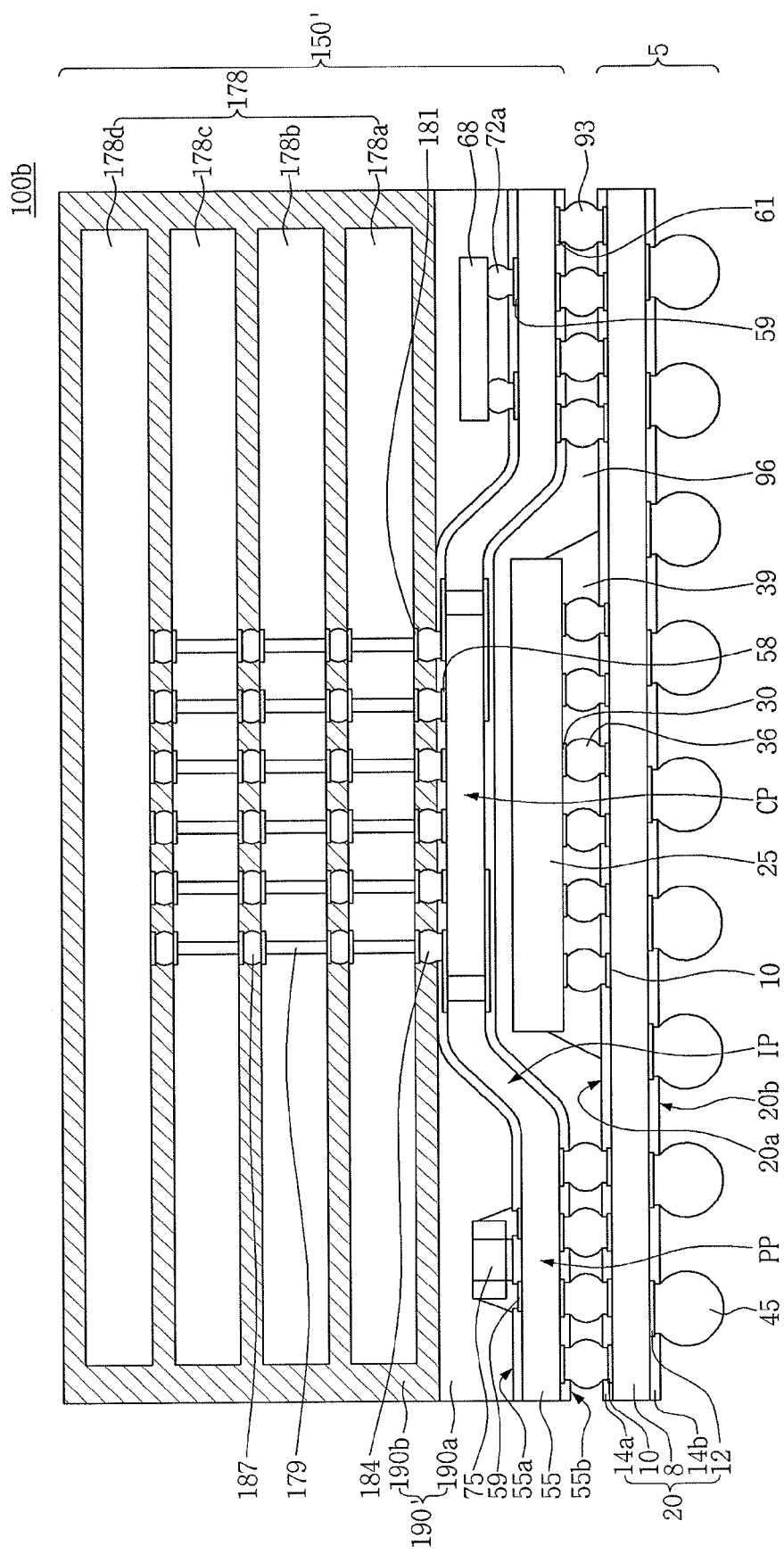
FIG. 8 illustrates a cross-sectional view of a semiconductor package in accordance with another embodiment.

A semiconductor package 100b in accordance with an embodiment will be described with reference to FIG. 8. FIG. 8 is a cross-sectional view showing the semiconductor package in accordance with an embodiment.

Referring to FIG. 8, the semiconductor package 100b in accordance with an embodiment may include the lower package 5, an upper package 150' disposed on the lower package 5, and the package interconnection structures 93 which electrically connect the upper package 150' to the lower package 5. The lower package 5 may include the lower substrate 20, the lower semiconductor chip structure 25 mounted on the upper surface 20a of the lower substrate 20, and the lower connection structures 45 disposed on the lower surface 20b of the lower substrate 20, which are the same as those described in FIG. 1.

The upper package 150' may include the upper substrate 55, and the peripheral component structures 68 and 75 mounted on the second part PP of the upper substrate 55, which are the same as those described in FIGS. 1 to 4. The upper package 150' may also include the upper semiconductor chip structure 178 mounted on the first part CP of the upper substrate 55, as described in FIG. 8.

Further, as illustrated in FIG. 8, the upper package 150' may include a molding layer 190' which is disposed on the upper substrate 55 and covers the upper semiconductor chip structure 178 and the peripheral component structures 68 and 75. The molding layer 190' may include a lower molding layer 190a, which is disposed on the upper surfaces of the second part PP and the third part IP of the upper substrate 55 and covers the peripheral component structures 68 and 75, and an upper molding layer 190b, which is disposed on the first part CP of the upper substrate 55 and on the lower molding layer 190a and surrounds the upper semiconductor chip structure 178. The lower and upper molding layers 190a and 190b may include different materials, or may be include a same material and be integrated with each other. Further, additional molding layers, e.g., a separate molding layer for each upper semiconductor chip of the upper semiconductor chip structure 178 may be used.

The package interconnection structures 93, as described in FIG. 1, may be disposed between the lower package 5 and the upper package 150', and may electrically connect the lower package 5 to the upper package 150'.

Figure 9:
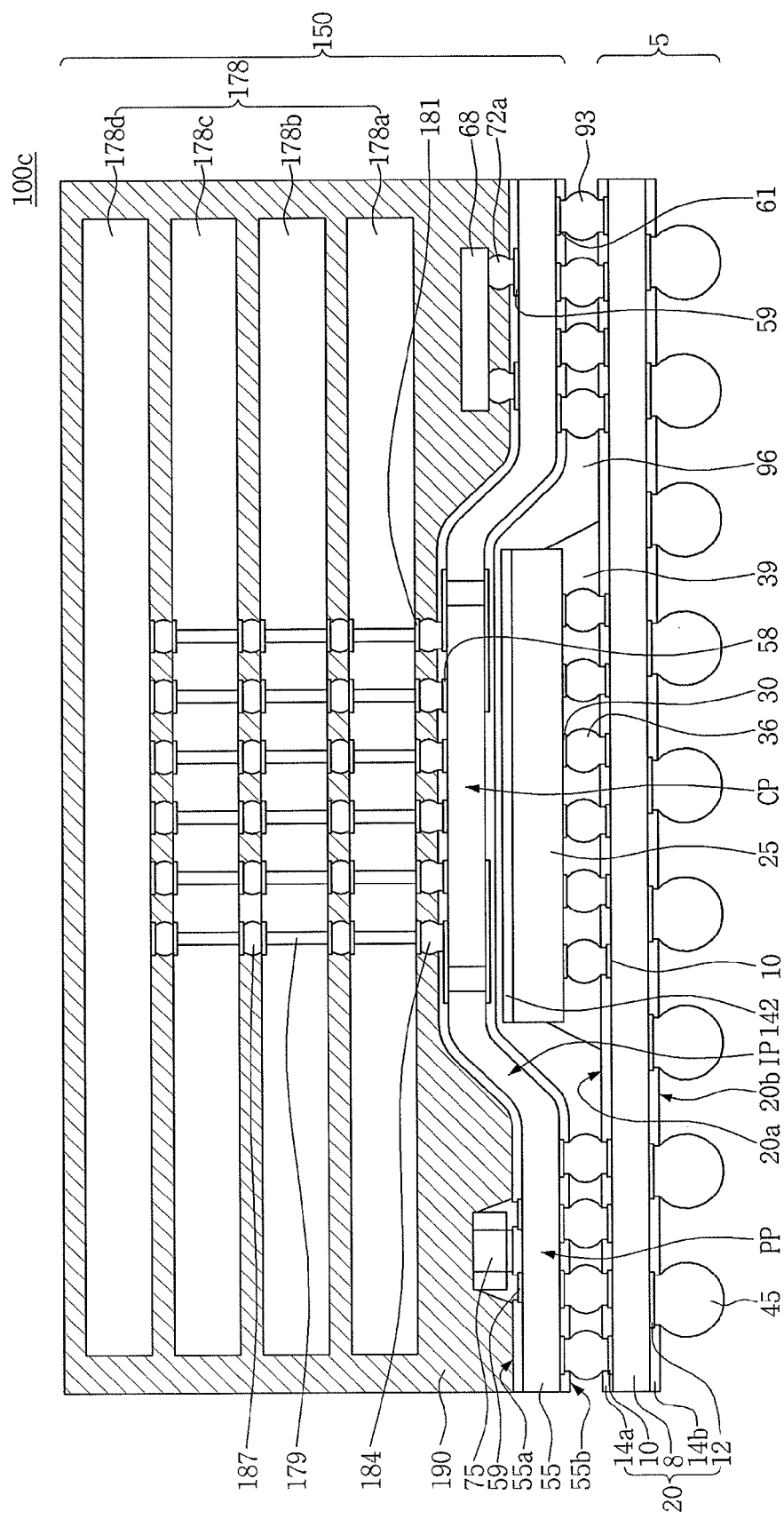
FIG. 9 illustrates a cross-sectional view of a semiconductor package in accordance with another embodiment.

According to an embodiment, a semiconductor package including a heat dissipation member may be provided. The semiconductor package 100c including the heat dissipation member in accordance with an embodiment will be described with reference to FIG. 9. FIG. 9 is a cross-sectional view showing the semiconductor package 100c in accordance with an embodiment.

Referring to FIG. 9, the semiconductor package 100c in accordance with an embodiment, as described in FIG. 7, may include the lower package 5, the upper package 150, and the package interconnection structures 93 disposed between the lower package 5 and the upper package 150. The semiconductor package 100c may further include a heat dissipation member 142 disposed on the upper surface of the lower semiconductor chip structure 25 of the lower package 5. The heat dissipation member 142 may be formed of a TIM. The heat dissipation member 142 may emit and dissipate heat generated inside the lower semiconductor chip structure 25.

Figure 10:
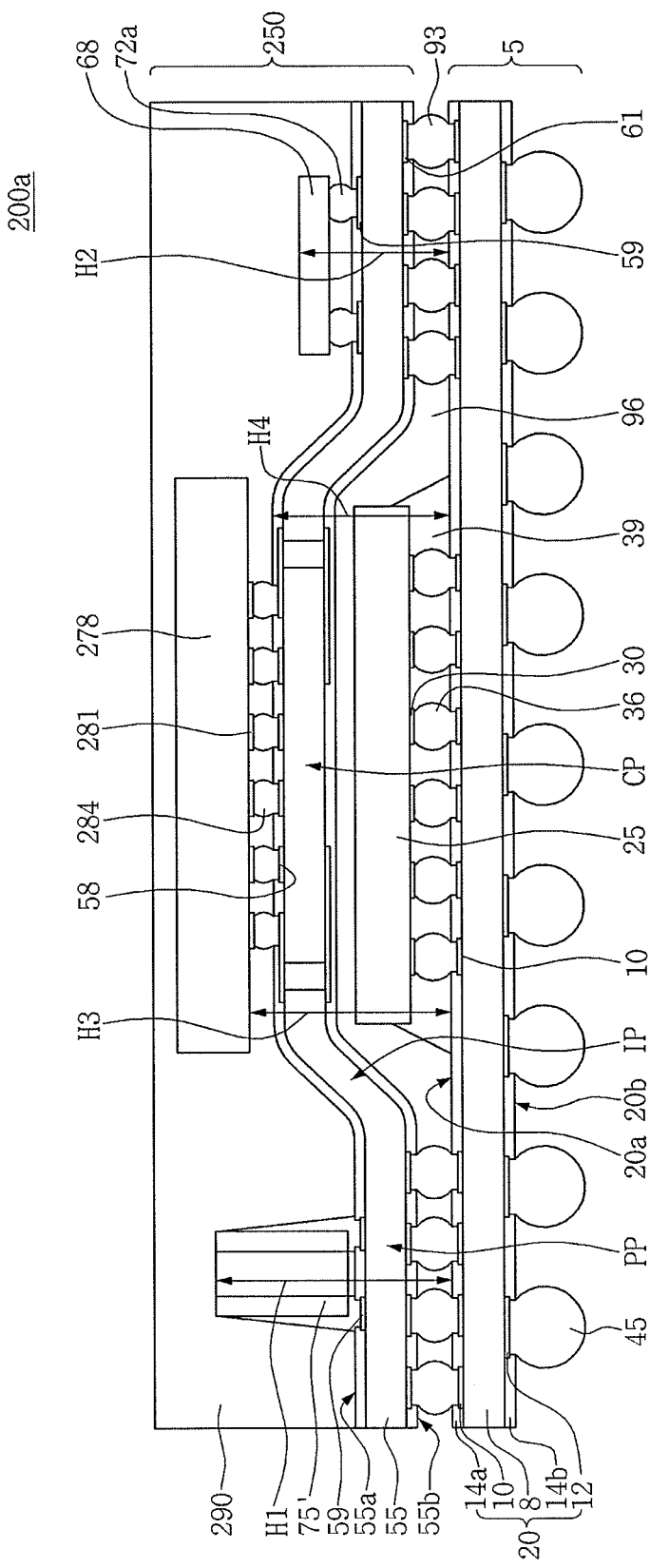
FIG. 10 illustrates a cross-sectional view of a semiconductor package in accordance with another embodiment.

A semiconductor package 200a in accordance with an embodiment will be described with reference to FIG. 10. FIG. 10 is a cross-sectional view of the semiconductor package 200a in accordance with an embodiment.

Referring to FIG. 10, the semiconductor package 200a in accordance with an embodiment may include the lower package 5, an upper package 250 disposed on the lower package 5, and the package interconnection structures 93 which are disposed between the upper package 250 and the lower package 5 and electrically connect the upper package 250 to the lower package 5. The lower package 5, may include the lower substrate 20, the lower semiconductor chip structure 25 mounted on the upper surface 20a of the lower substrate 20, and the lower connection structures 45 disposed on the lower surface 20b of the lower substrate 20, which are the same as those described in FIG. 1.

The upper package 250 may include the substrate 55 having the first part CP, the second part PP, and the third part IP disposed between the first part CP and the second parts PP, which are the same as those described in FIGS. 1 to 4. The upper package 250 may include an upper semiconductor chip structure 278 mounted on the first part CP of the upper substrate 55, and peripheral component structures 68 and 75' mounted on the second part PP of the upper substrate 55.

The upper package 250 may include a molding layer 290 which covers the upper surface 55a of the upper substrate 55, the upper semiconductor chip structure 278, and the peripheral component structures 68 and 75'. The upper semiconductor chip structure 278 may be mounted on the first part CP of the upper substrate 55 in a flip chip structure. The upper semiconductor chip structure 278 may include upper chip pads 281 disposed on surface facing the upper substrate 55.

The upper semiconductor chip structure 278 may be electrically connected to the first part CP of the upper substrate 55 by upper chip interconnection structures 284 interposed between the upper semiconductor chip structure 278 and the first part CP of the upper substrate 55. The upper chip interconnection structures 284 may be interposed between the upper chip pads 281 of the upper semiconductor chip structure 278 and first pads 58 of the first part CP of the upper substrate 55, and may electrically connect the upper semiconductor chip structure 278 to the upper substrate 55.

In an embodiment, the peripheral component structures 68 and 75' may include a thick peripheral component 75' having an upper surface located further away from the lower substrate 20 than the upper surface 55a of the first part CP of the upper substrate 55. In other words, thickness, i.e., height, of the peripheral component 75' along the y-axis may be increased, such that a distance between the upper surface of the peripheral component 75' and the lower substrate 20 may be larger than a distance between the upper surface 55a of the first part CP of the upper substrate 55 and the lower substrate 20. In this case, a distance between the upper surface of the peripheral component 75' and the lower substrate 20 may be smaller than a distance between an upper surface of the upper semiconductor chip structure 278 and the lower substrate 20.

The thick peripheral component 75' may be a passive device, e.g., a capacitor having an increased size to increase capacity thereof. As the thick peripheral component 75' is implemented in the semiconductor package 200a, functionality and/or performance of the semiconductor package 200a may be improved.

In an embodiment, the peripheral component structures 68 and 75' may include a plurality of peripheral components 68 and 75' having different thicknesses. For example, the peripheral component structures 68 and 75' may include a relatively thin peripheral component 68 and a relatively thick peripheral component 75'.

A distance H1 between an upper surface of the thick peripheral component 75' and the lower substrate 20 may be greater than a distance H3 between a lower surface of the upper semiconductor chip structure 278 and the lower substrate 20. The distance H1 between the upper surface of the thick peripheral component 75' and the lower substrate 20 may be greater than a distance H4 between the upper surface 55a of the first part CP of the upper substrate 55 and the lower substrate 20. The distance H1 between the upper surface of the thick peripheral component 75' and the lower substrate 20 may be greater than a distance H2 between an upper surface of the thin peripheral component 68 and the lower substrate 20. The thick peripheral component 75' may not overlap the lower surface of the upper semiconductor chip structure 278.

Figure 11:
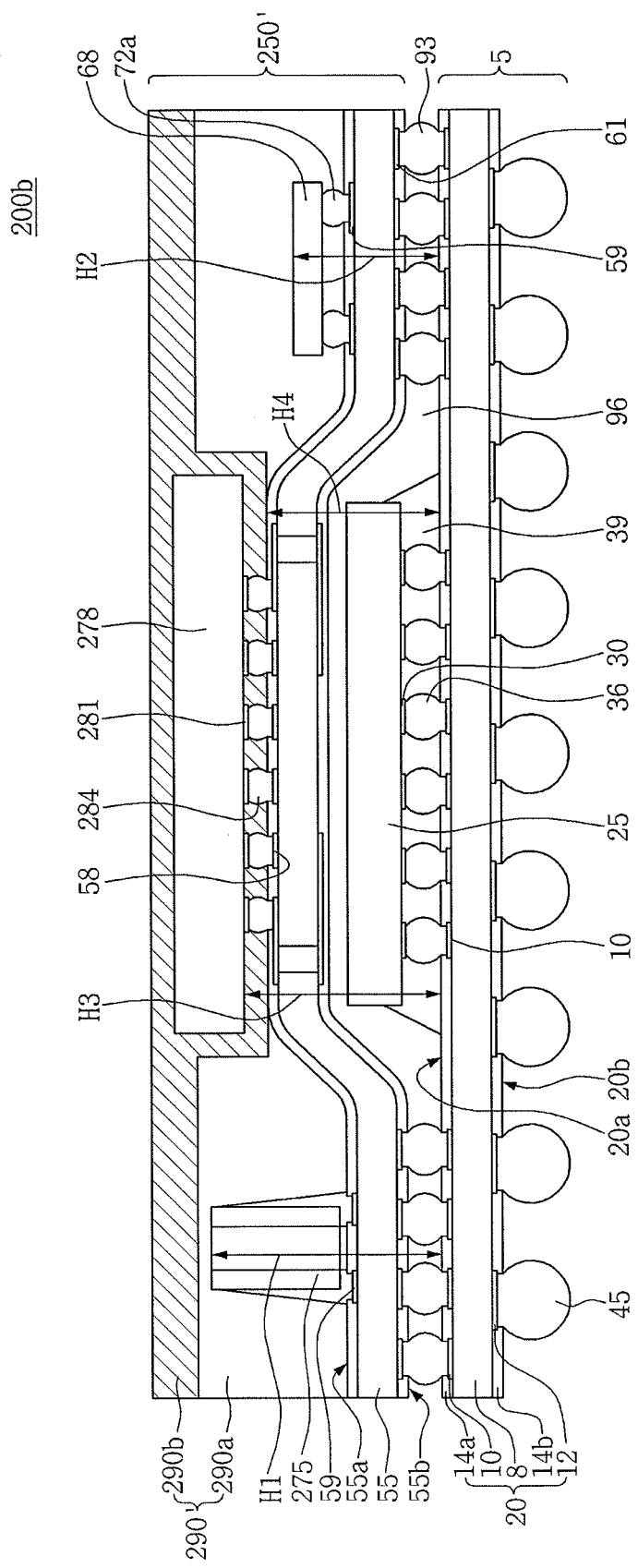
FIG. 11 illustrates a cross-sectional view showing a semiconductor package in accordance with an embodiment.

A semiconductor package 200b in accordance with an embodiment will be described with reference to FIG. 11. FIG. 11 is a cross-sectional view of the semiconductor package 200b in accordance with an embodiment.

Referring to FIG. 11, the semiconductor package 200b in accordance with an embodiment may include the lower package 5, an upper package 250' disposed on the lower package 5, and the package interconnection structures 93 which electrically connect the upper package 250' to the lower package 5. The lower package 5 may include the lower substrate 20, the lower semiconductor chip structure 25 mounted on the upper surface 20a of the lower substrate 20, and the lower connection structures 45 disposed on the lower surface 20b of the lower substrate 20, which are the same as those described in FIG. 1.

The upper package 250' may include the upper substrate 55 having the first part CP, the second part PP, the third part IP disposed between the first part CP and the second part PP, which are the same as those described in FIGS. 1 to 4. The upper package 250' may also include the upper semiconductor chip structure 278 mounted on the first part CP of the upper substrate 55, and peripheral component structures 68 and 75' mounted on the second part PP of the upper substrate 55, which are the same as those described in FIG. 10.

As further illustrated in FIG. 1, the upper package 250' may include a molding layer 290' which is disposed on the upper substrate 55 and covers the upper semiconductor chip structure 278, and the peripheral component structures 68 and 75'. The molding layer 290' may include a lower molding layer 290a, which is disposed on upper surfaces of the second part PP and the third part IP of the upper substrate 55 and covers the peripheral component structures 68 and 75', and an upper molding layer 290b, which is disposed on the first part CP of the upper substrate 55 and the lower molding layer 290a and surrounds the upper semiconductor chip structure 278. The lower molding layer 290a may have an upper surface located at a higher level than the first part CP of the upper substrate 55.

The package interconnection structures 93, as described in FIG. 1, may be disposed between the lower package 5 and the upper package 250', and may electrically connect the lower package 5 to the upper package 250'.

Figure 12:
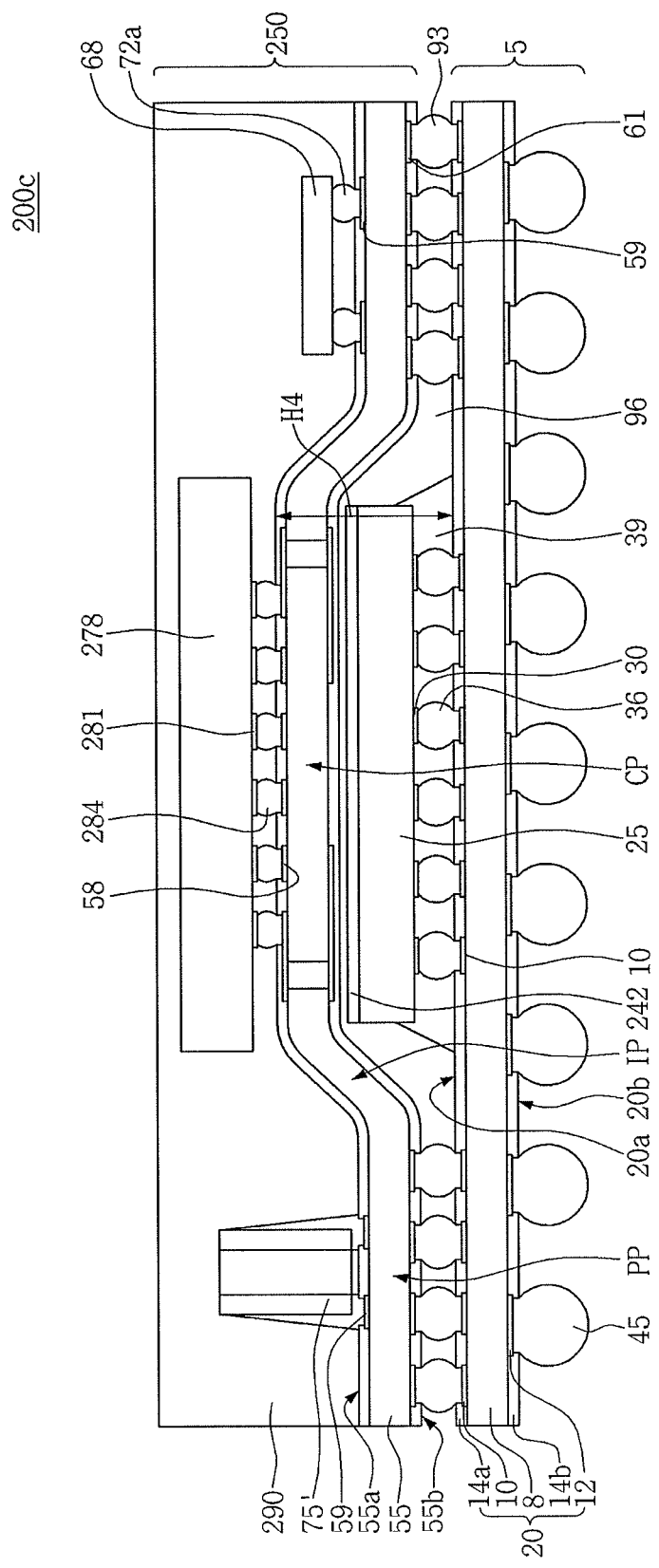
FIG. 12 illustrates a cross-sectional view of a semiconductor package in accordance with another embodiment.

According to an embodiment, a semiconductor package including a heat dissipation member may be provided. A semiconductor package 200c including the heat dissipation member in accordance with an embodiment will be described with reference to FIG. 12. FIG. 12 is a cross-sectional view showing the semiconductor package 200c in accordance with an embodiment.

Referring to FIG. 12, the semiconductor package 200c in accordance with an embodiment may include the lower package 5, the upper package 250, and the package interconnection structures 93 disposed between the lower package 5 and the upper package 250, which are the same as those described in FIG. 10. The semiconductor package 200c may further include a heat dissipation member 242 disposed on the upper surface of the lower semiconductor chip structure 25 of the lower package 5. The heat dissipation member 242 may be formed of a TIM.

Figure 13:
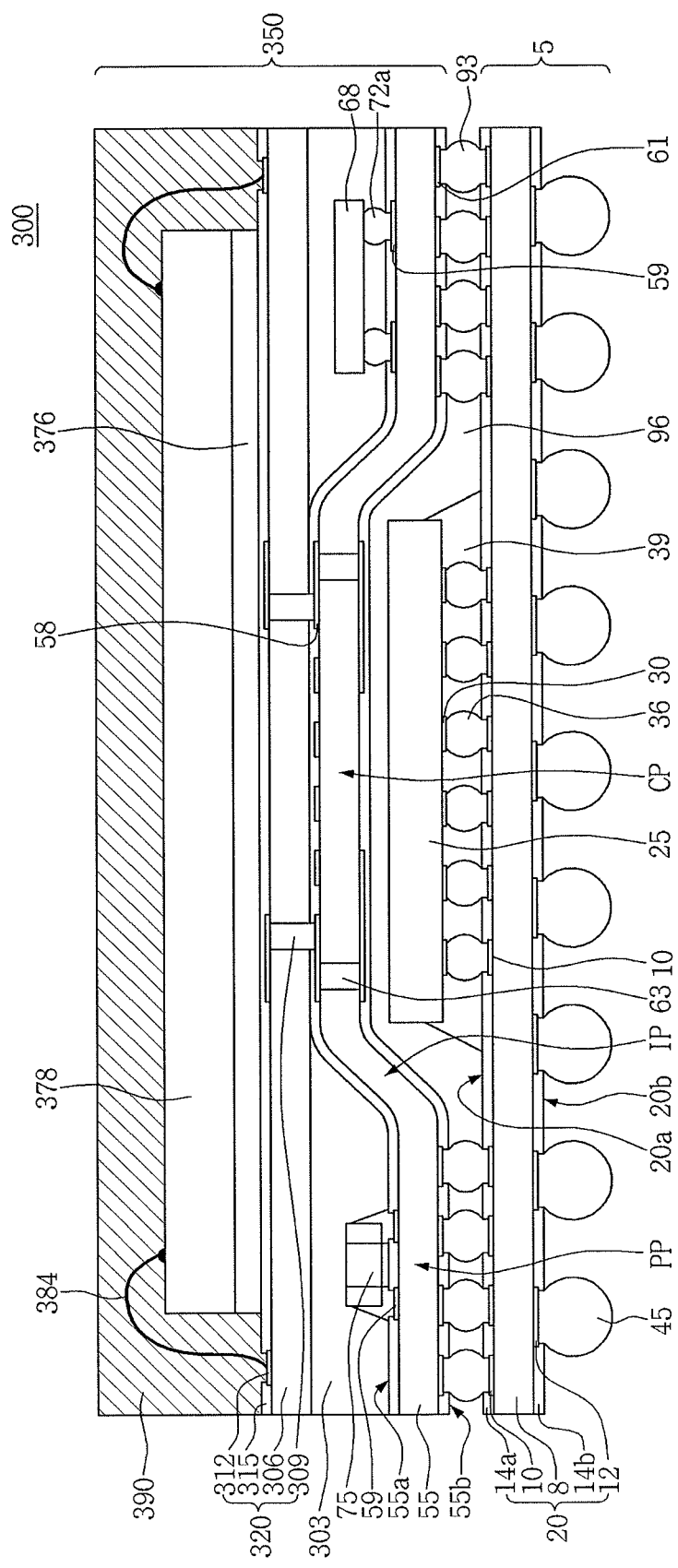
FIG. 13 illustrates a cross-sectional view of a semiconductor package in accordance with another embodiment.

A semiconductor package 300 in accordance with an embodiment will be described with reference to FIG. 13. FIG. 13 is a cross-sectional view showing the semiconductor package 300 in accordance with an embodiment.

Referring to FIG. 13, the semiconductor package 300 in accordance with an embodiment may include the lower package 5, an upper package 350 disposed on the lower package 5, and the package interconnection structures 93 which are disposed between the upper package 350 and the lower package 5 and electrically connect the upper package 350 to the lower package 5. The lower package 5 may include the lower substrate 20, the lower semiconductor chip structure 25 mounted on the upper surface 20a of the lower substrate 20, and the lower connection structures 45 disposed on the lower surface 20b of the lower substrate 20, which are the same as those described in FIG. 1.

The upper package 350 may include the upper substrate 55 having the first part CP, the second part PP, and the third part IP disposed between the first part CP and the second part PP, and the peripheral component structures 68 and 75 mounted on the second part PP of the upper substrate 55, which are the same as those described in FIGS. 1 to 4. Further, the upper package 350 may include a substrate molding layer 303, an interposer substrate 320, and an upper semiconductor chip structure 378.

The substrate molding layer 303 may be disposed on the second part PP and the third part IP of the upper substrate 55. The substrate molding layer 303 may cover the peripheral component structures 68 and 75. The substrate molding layer 303 may be interposed between the upper substrate 55 and the interposer substrate 320.

The interposer substrate 320 may contact the first part CP of the upper substrate 55 and the substrate molding layer 303. The interposer substrate 320 may be formed by performing a printed circuit board forming process.

The interposer substrate 320 may include a base 306, wiring structures 309 disposed in the base 306, pads 312 disposed on the base 306, and a surface layer 315 disposed on the base 306 and exposes the pads 312. The wiring structures 309 may be electrically connected to the first pads 58 of the first part CP of the upper substrate 55.

The upper semiconductor chip structure 378 may be mounted on the interposer substrate 320 in a wire bonding structure. An adhesive member 376 which bonds the upper semiconductor chip structure 378 to the interposer substrate 320 may be disposed between the upper semiconductor chip structure 378 and the interposer substrate 320. Bonding wires 384 which connect an upper surface of the upper semiconductor chip structure 378 to the pads 312 of the interposer substrate 320 may be disposed. An upper molding layer 390, which covers the upper semiconductor chip structure 378, may be disposed on the interposer substrate 320.

Figure 14:
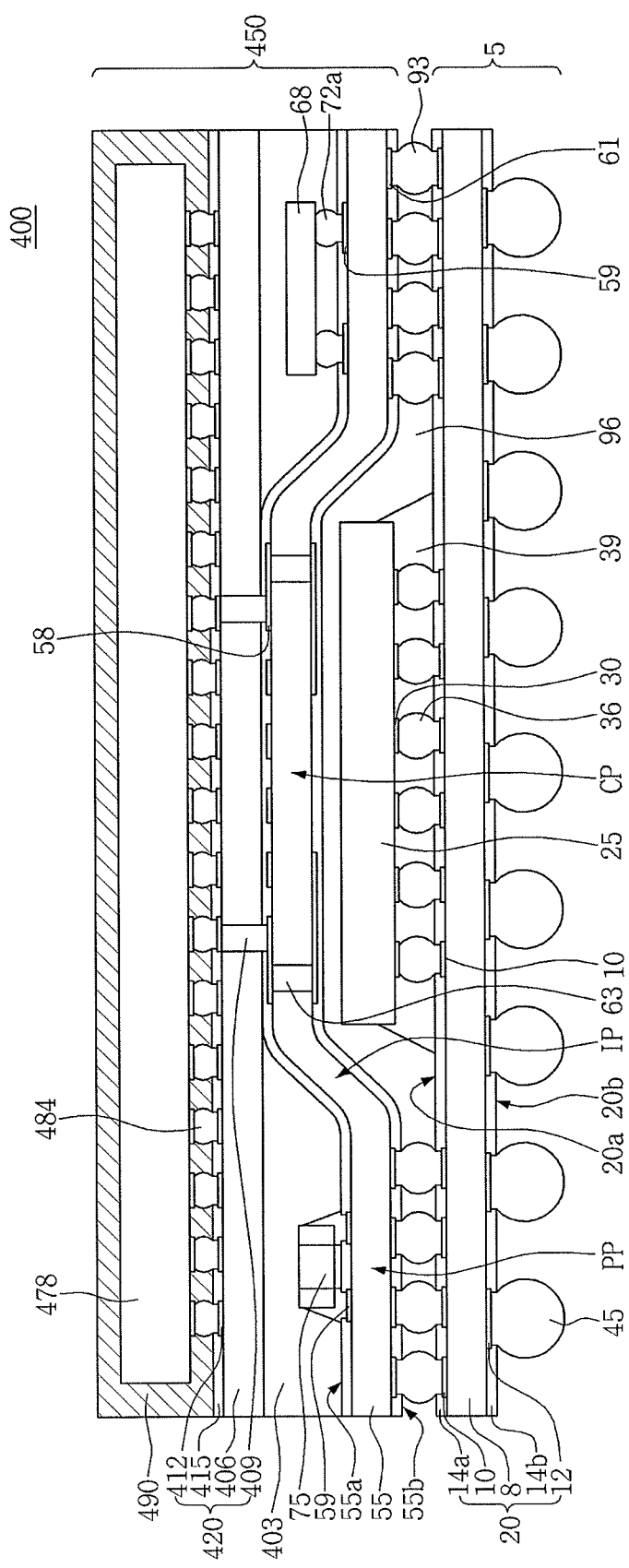
FIG. 14 illustrates a cross-sectional view of a semiconductor package in accordance with another embodiment.

A semiconductor package in accordance with an embodiment will be described with reference to FIG. 14. FIG. 14 is a cross-sectional view of the semiconductor package in accordance with an embodiment.

Referring to FIG. 14, a semiconductor package 400 in accordance with an embodiment may include the lower package 5, an upper package 450 disposed on the lower package 5, and the package interconnection structures 93 which are disposed between the upper package 450 and the lower package 5 and electrically connect the upper package 450 to the lower package 5. The lower package 5 may include the lower substrate 20, the lower semiconductor chip structure 25 mounted on the upper surface 20a of the lower substrate 20, and the lower connection structures 45 disposed on the lower surface 20b of the lower substrate 20, which are the same as those described in FIG. 1.

The upper package 450 may include the upper substrate 55 having the first part CP, the second part PP, and the third part IP disposed between the first part CP and the second part PP, and the peripheral component structures 68 and 75 mounted on the second part PP of the upper substrate 55, which are the same as those described in FIGS. 1 to 4.

The upper package 450 may include a substrate molding layer 403, which is disposed on the second part PP and the third part IP of the upper substrate 55 and covers the peripheral component structures 68 and 75, an interposer substrate 420 disposed on the first part CP of the upper substrate 55 and the substrate molding layer 403, and an upper semiconductor chip structure 478 mounted on the interposer substrate 420. The substrate molding layer 403 may be substantially the same as the substrate molding layer 303 in FIG. 13.

The interposer substrate 420 may contact the first part CP of the upper substrate 55 and the substrate molding layer 403. The interposer substrate 420 may be formed by performing a printed circuit board forming process.

The interposer substrate 420 may include a base 406, wiring structures 409 disposed in the base 406, pads 412 disposed on the base 406, and a surface layer 415 that is disposed on the base 406 and exposes the pads 412. The wiring structures 409 may be electrically connected to the first pads 58 of the first part CP of the upper substrate 55.

An upper semiconductor chip structure 478 may be mounted on the interposer substrate 420 in a flip chip structure. Upper chip interconnection structures 484, which electrically connect the upper semiconductor chip structure 478 to the interposer substrate 420, may be interposed between the upper semiconductor chip structure 478 and the interposer substrate 420. An upper molding layer 490 which covers the upper semiconductor chip structure 478 may be disposed on the interposer substrate 420.

Figure 15:
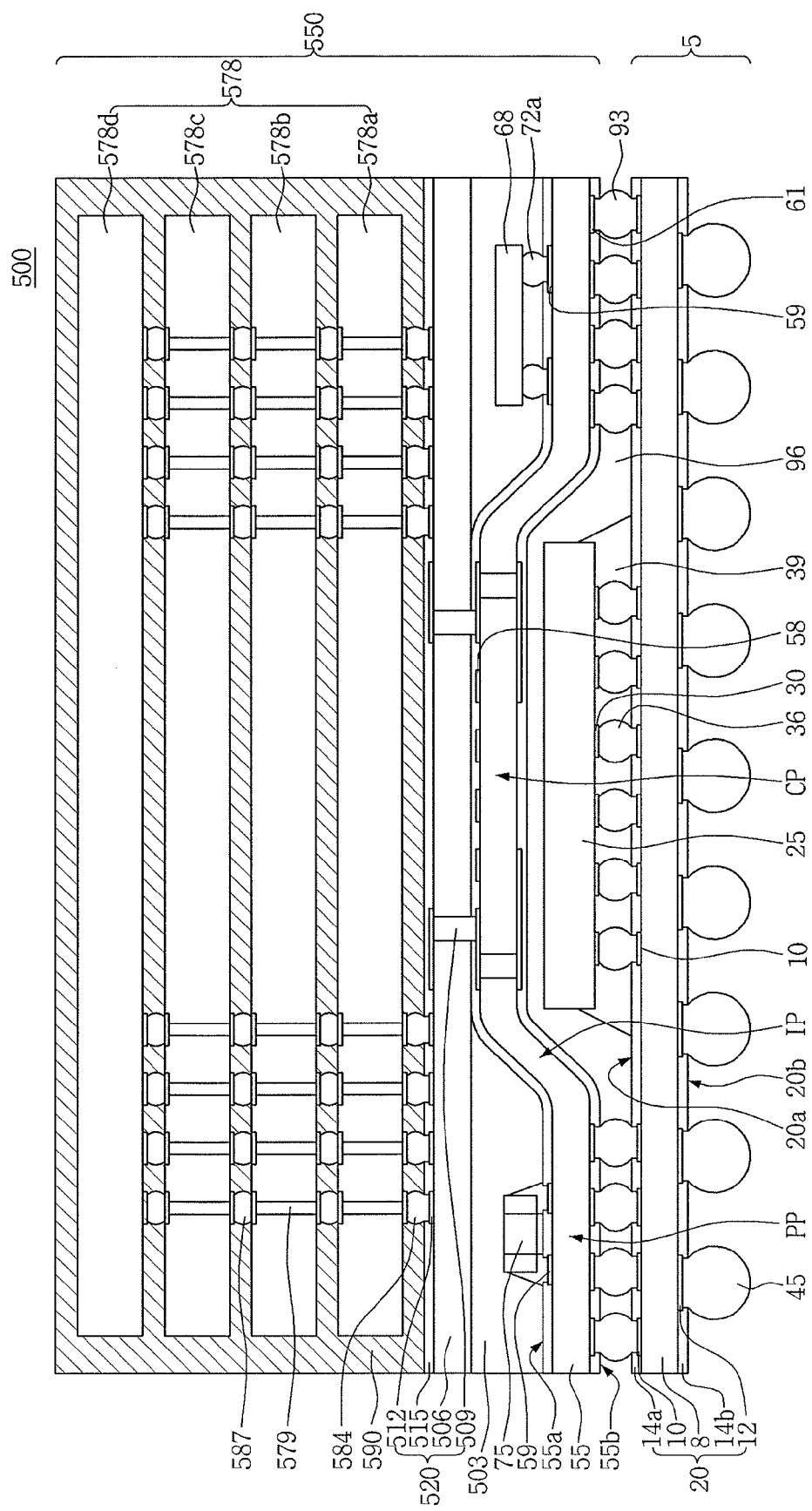
FIG. 15 illustrates a cross-sectional view of a semiconductor package in accordance with another embodiment.

A semiconductor package in accordance with an embodiment will be described with reference to FIG. 15. FIG. 15 is a cross-sectional view showing a semiconductor package in accordance with an embodiment.

Referring to FIG. 15, a semiconductor package 500 in accordance with an embodiment may include the lower package 5, an upper package 550 disposed on the lower package 5, and the package interconnection structures 93 which are disposed between the upper package 550 and the lower package 5 and electrically connect the upper package 550 to the lower package 5. The lower package 5 may include the lower substrate 20, the lower semiconductor chip structure 25 mounted on the upper surface 20a of the lower substrate 20, and the lower connection structures 45 disposed on the lower surface 20b of the lower substrate 20, which are the same as those described in FIG. 1.

The upper package 550 may include the upper substrate 55 having the first part CP, the second part PP, and the third part IP disposed between the first part CP and the second part PP, and the peripheral component structures 68 and 75 mounted on the second parts PP of the upper substrate 55, which are the same as those described in FIGS. 1 to 4.

The upper package 550 may include a substrate molding layer 503 which is disposed on the second part PP and the third part IP of the upper substrate 55 and covers the peripheral component structures 68 and 75, an interposer substrate 520 which is disposed on the first part CP of the upper substrate 55 and the substrate molding layer 503, and an upper semiconductor chip structure 578 mounted on the interposer substrate 520. The substrate molding layer 503 may be substantially the same as the substrate molding layer 303 in FIG. 13

The interposer substrate 520 may contact the first part CP of the upper substrate 55 and the substrate molding layer 503. The interposer substrate 520 may include a base 506, wiring structures 509 disposed in the base 506, pads 512 disposed on the base 506, and a surface layer 515 which is disposed on the base 506 and exposes the pads 512. The wiring structures 509 may be electrically connected to the first pads 58 of the first part CP of the upper substrate 55.

The upper semiconductor chip structure 578 may include a plurality of upper semiconductor chips 578a, 578b, 578c, and 578d, and upper chip interconnection structures 587 which electrically connect the upper semiconductor chips 578a, 578b, 578c, and 578d. For example, the upper semiconductor chips 578a, 578b, 578c, and 578d may include a first upper semiconductor chip 578a, a second upper semiconductor chip 578b, a third upper semiconductor chip 578c, and a fourth upper semiconductor chip 578d, which are sequentially stacked. The first to third upper semiconductor chips 578a to 578c may include through-electrodes 579 passing through the first to third upper semiconductor chips 578a to 578c. The upper chip interconnection structures 587 may be electrically connected to the through-electrodes 579.

The upper semiconductor chip structure 578 may be mounted on the interposer substrate 520 in a flip chip structure. The upper semiconductor chip structure 578 may be electrically connected to the interposer substrate 520 by upper chip interconnection structures 584 interposed between the upper semiconductor chip structure 578 and the interposer substrate 520.

An upper molding layer 590 which covers the upper semiconductor chip structure 578 may be disposed on the interposer substrate 520. The upper molding layer 590 may fill between the upper semiconductor chips 578a, 578b, 578c, and 578d.

Figure 16A:
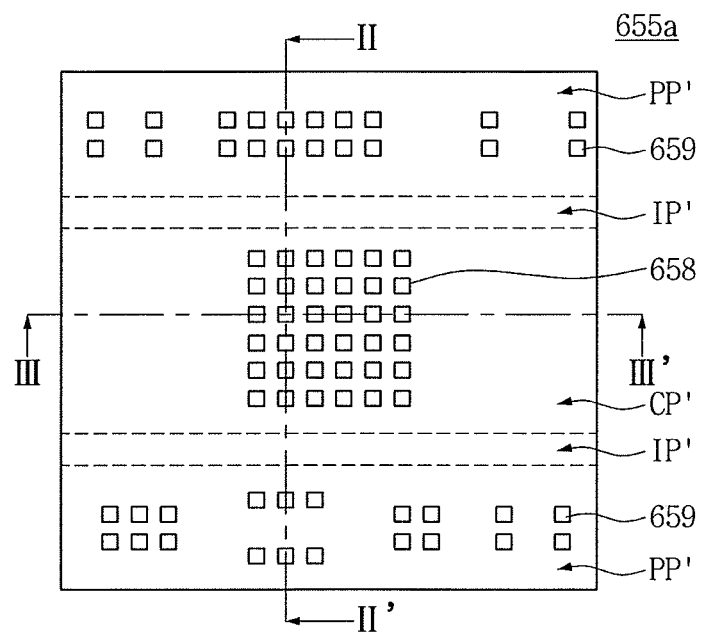
FIG. 16A illustrates a top view of an upper surface of an upper substrate of a semiconductor package in accordance with an embodiment.
Figure 16B:
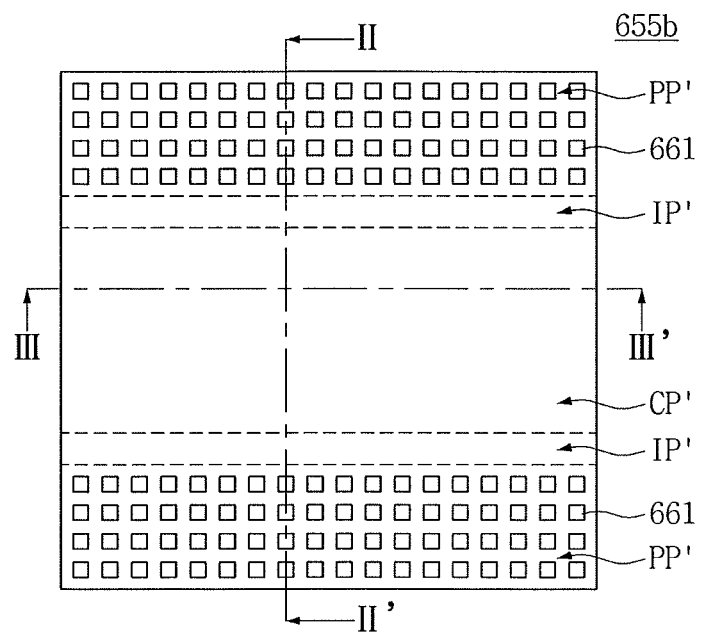
FIG. 16B illustrates a bottom view of a lower surface of an upper substrate of a semiconductor package in accordance with an embodiment.

Next, an upper substrate of a semiconductor package in accordance with an embodiment will be described with reference to FIGS. 16A to 16C. FIG. 16A is a top view of an upper surface of the upper substrate of the semiconductor package in accordance with an embodiment. FIG. 16B is a bottom view of a lower surface of the upper substrate of the semiconductor package in accordance with an embodiment.

Figure 16C:
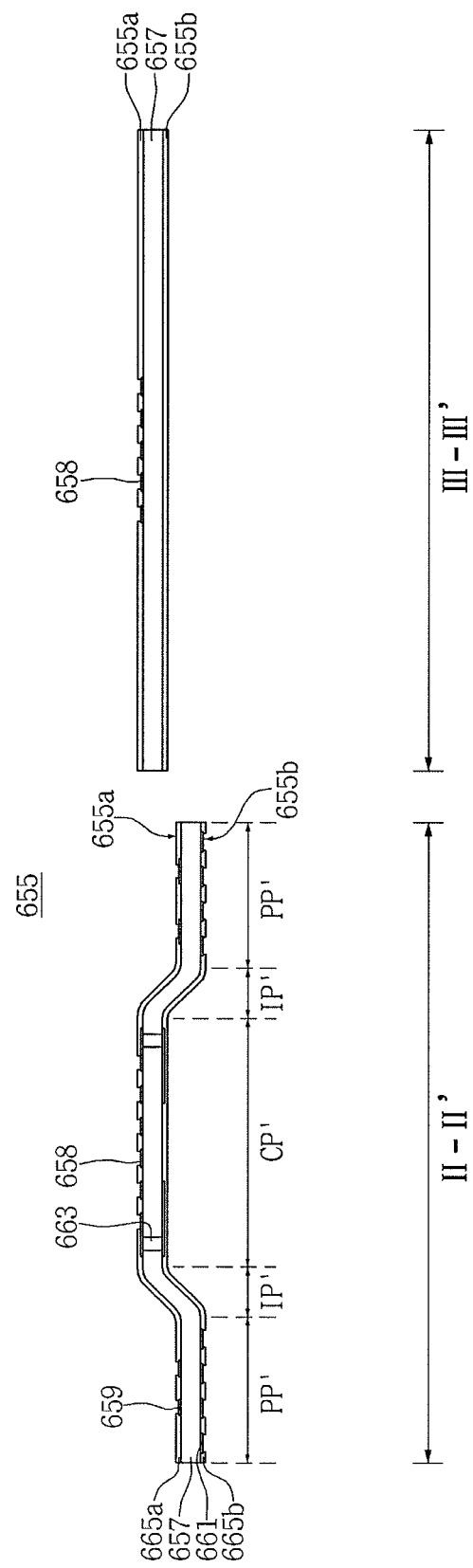
FIG. 16C illustrates cross-sectional views of the upper substrate in FIGS. 16A and 16B along lines II-II' and III-III'.

FIG. 16C shows cross-sectional views of regions taken along lines II-IF and of FIGS. 16A and 16B.

Referring to FIGS. 16A to 16C, a semiconductor package in accordance with an embodiment may include an upper substrate 655. The upper substrate 655 may include a first part CP', second parts PP' located at both sides of the first part CP', and third parts IP' located between the first part CP' and the second parts PP'. The first part CP' in the upper substrate 655 may be disposed between the second parts PP'. The first part CP' may be a central part of the upper substrate 655. The second parts PP' may be peripheral parts located at both sides of the central part of the upper substrate 655. The first part CP' and the second parts PP' may be located at different levels. The third part IP' may be an inclined part resulting from a difference between the levels of the first part CP' and the second parts PP'. A thickness of the first part CP' of the upper substrate 655 may be the same as that of the second part PP'.

The upper substrate 655 may include a base 657, first pads 658, second pads 659, internal wiring structures 663, a first surface layer 665a, and a second surface layer 665b. The first pads 658 of the upper substrate 655 may be disposed on an upper surface 655a of the first part CP' of the upper substrate 655. The second pads 659 of the upper substrate 655 may be disposed on an upper surface 655a of the second parts PP' of the upper substrate 655. The first surface layer 665a of the upper substrate 655 may be disposed on the upper surface 655a of the upper substrate 655 and have openings which expose the first pads 658 and the second pads 659. The upper substrate 655 may be formed of the same material as the upper substrate 55 described in FIGS. 1 to 4.

Figure 17:
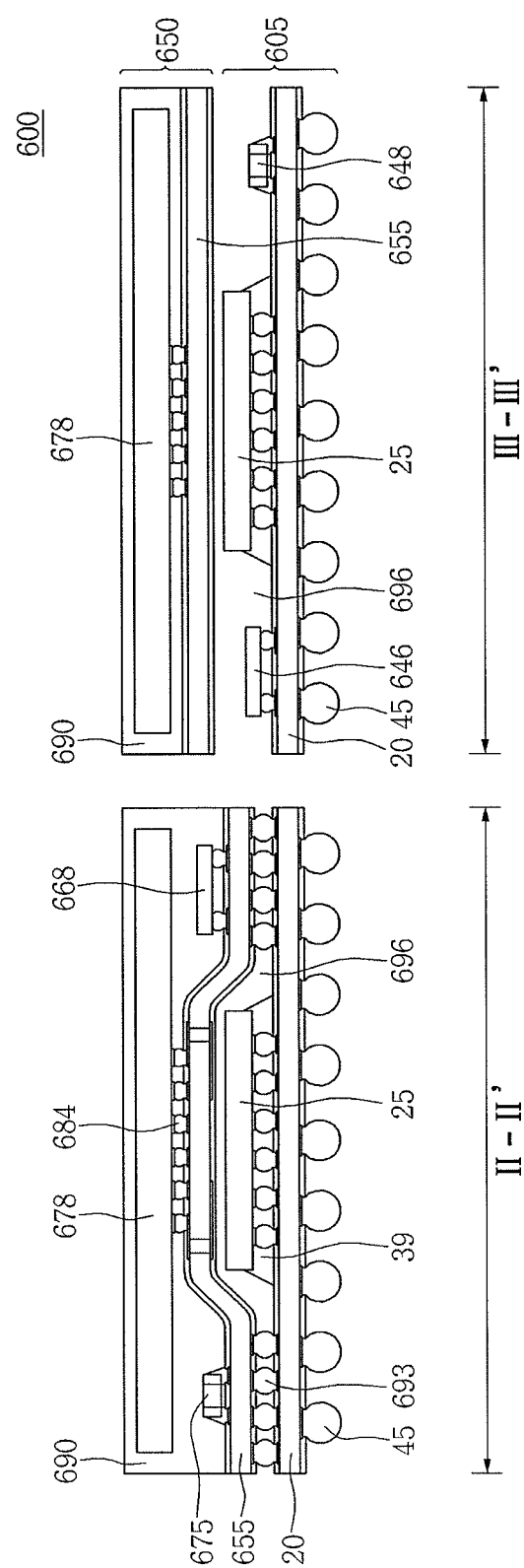
FIG. 17 illustrates cross-sectional views of a semiconductor package including the upper substrate of FIG. 16C.
Figure 18:
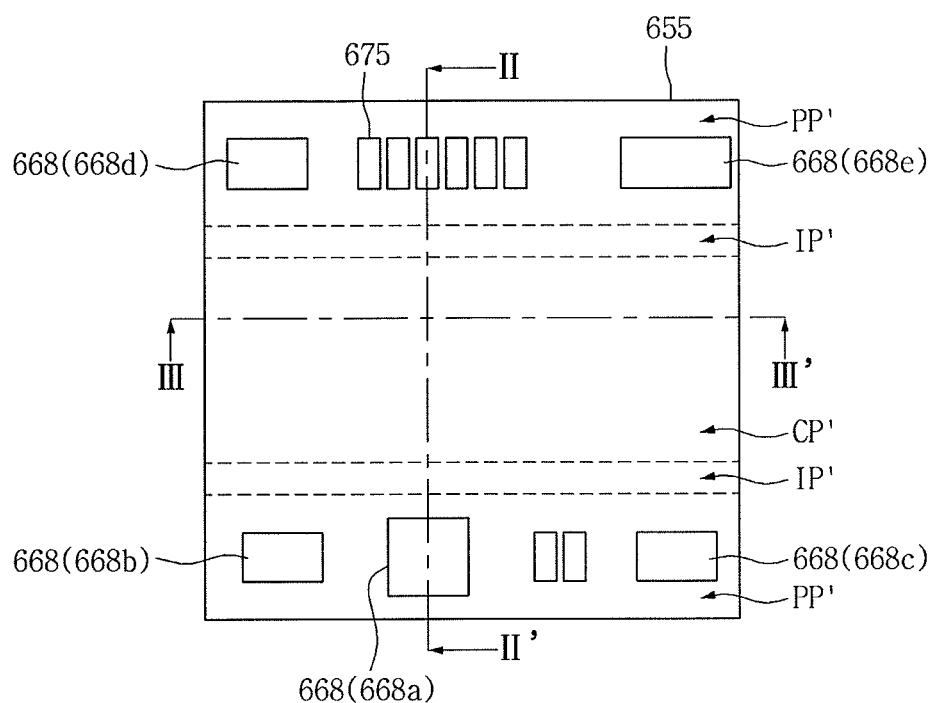
FIG. 18 illustrates a top view of an upper substrate and a peripheral component structure of the semiconductor package in FIG. 17.

A semiconductor package in accordance with an embodiment will be described with reference to FIGS. 17 and 18. FIG. 17 illustrates cross-sectional views showing the semiconductor package in accordance with an embodiment. FIG. 18 is a top view showing an upper substrate and a peripheral component structure of the semiconductor package in accordance with an embodiment. The cross-sectional views of FIG. 17 are takes along lines II-II' and III-III' of FIG. 18.

Referring to FIGS. 17 and 18, a semiconductor package 600 in accordance with an embodiment may include a lower package 605, an upper package 650 disposed on the lower package 605, and package interconnection structures 693 disposed between the upper package 650 and the lower package 605. The lower package 605 may include the lower substrate 20, the lower semiconductor chip structure 25 mounted on the upper surface of the lower substrate 20, and the lower interconnection structures 45 disposed under a lower surface of the lower substrate 20, which are the same as those described in FIG. 1.

The lower package 605 may further include lower peripheral component structures 646 and 648 mounted on the upper surface of the lower substrate 20. The lower peripheral component structures 646 and 648 may include a plurality of peripheral components. The lower peripheral component structures 646 and 648 may be disposed on the upper surface of the lower substrate 20 which is located near the lower semiconductor chip structure 25. The upper package 650 may further include the upper substrate 655 having the first part CP', the second part PP', and the inclined third part IP' located between the first part CP' and the second parts PP', which are the same as those described in FIGS. 16A to 16C.

The upper package 650 may include an upper semiconductor chip structure 678 mounted on the first part CP' of the upper substrate 655, upper peripheral component structures 668 and 675 mounted on the second parts PP' of the upper substrate 655, and a molding layer 690 which is disposed on the upper substrate 655 and covers the upper semiconductor chip structure 678 and the upper peripheral component structures 668 and 675.

The upper peripheral component structures 668 and 675 may include a plurality of different peripheral components. The upper peripheral component structures 668 and 675 may include an active device 668 and a passive device 675. The active device 668 may include a plurality of devices 668a, 668b, 668c, 668d, and 668e.

The upper peripheral component structures 668 and 675 and the lower peripheral component structures 646 and 648 may include parts which improve functionality of the semiconductor package 600, e.g., buffer chips, driver chips, power management ICs, analog devices, communication devices, controller chips, and/or passive devices. The communication device may be, e.g., a wireless communication chip. The passive device may be, e.g., a passive device such as a capacitor, etc.

The package interconnection structures 693 may be interposed between the lower package 605 and the upper package 650, and may electrically connect the lower package 605 to the upper package 650. The package interconnection structures 693 may be disposed under the second parts PP' of the upper substrate 655.

The semiconductor package 600 may include an empty space 696 between the lower package 605 and the upper package 650. The lower peripheral component structures 646 and 648 may be mounted on the lower substrate 20 and exposed by the empty space 696.

Figure 19:
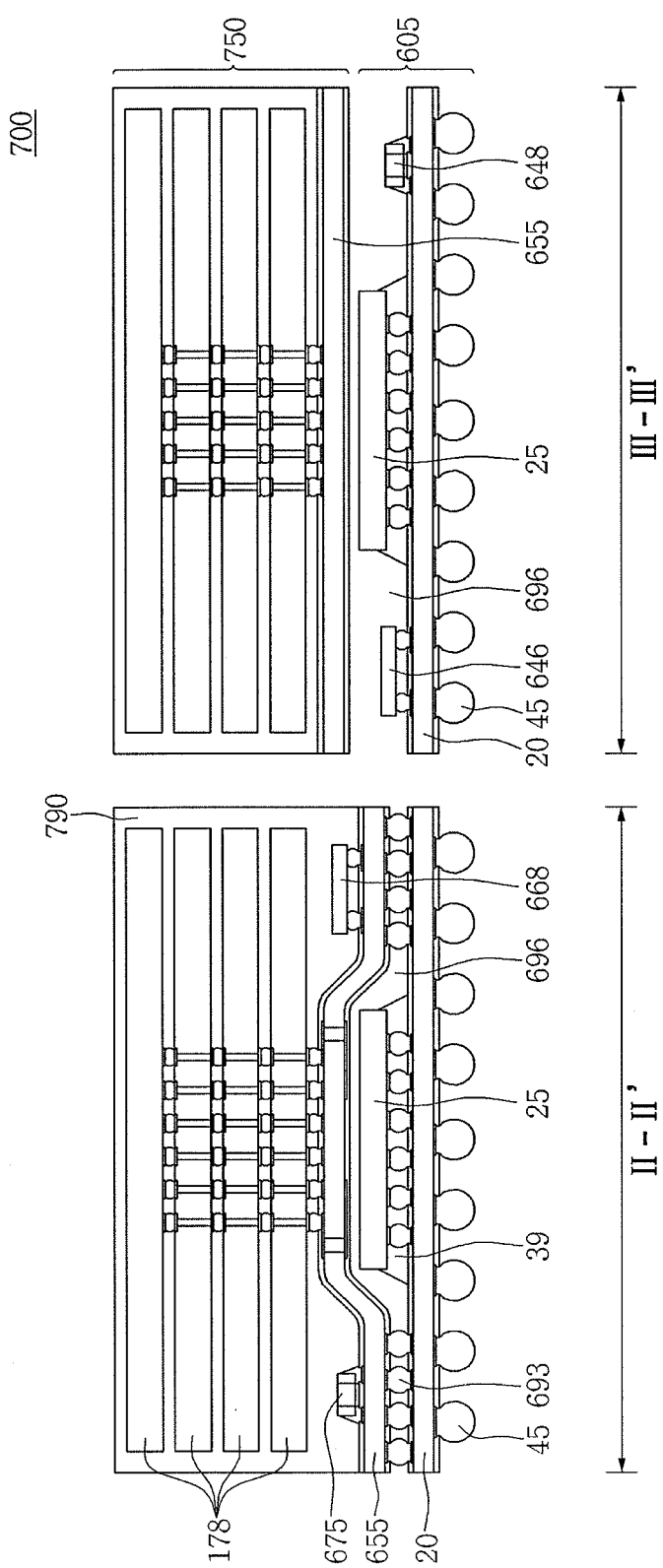
FIG. 19 illustrates cross-sectional views of a semiconductor package along lines II-II' and III-III' of FIG. 18 in accordance with the other embodiment.

A semiconductor package 700 in accordance with an embodiment will be described with reference to FIG. 19. FIG. 19 is a cross-sectional view of a semiconductor package 700 in accordance with an embodiment.

Referring to FIG. 19, the semiconductor package 700 in accordance with an embodiment may include the lower package 605 including the lower peripheral component structures 646 and 648, which are the same as those described in FIG. 17. The semiconductor package 700 may further include an upper package 750 disposed on the lower package 605, and the package interconnection structures 693 which are interposed between the upper package 750 and the lower package 605 and electrically connect the upper package 750 to the lower package 605.

The upper package 750 may include the upper substrate 655 having the first part CP', the second parts PP', and the inclined third parts IP' located between the first part CP' and the second parts PP', which are the same as those described in FIGS. 16A to 16C. The upper package 750 may also include the upper peripheral component structures 668 and 675 mounted on the second parts PP' of the upper substrate 655, which are the same as those described in FIGS. 17 and 18.

Further, the upper package 750 may include an upper semiconductor chip structure 178 mounted on the first part CP' of the upper substrate 655, and a molding layer 790 which covers the upper surface 655a of the upper substrate 655, the upper semiconductor chip structure 178, and the upper peripheral component structures 668 and 675.

The upper semiconductor chip structure 178 may include a plurality of upper semiconductor chips which are the same as those described in FIG. 7. The upper semiconductor chip structure 178 may be mounted on the first part CP' of the upper substrate 655 in a flip chip structure.

The molding layer 790 may be disposed on the upper substrate 655. The molding layer 790 may cover the upper peripheral component structures 668 and 675 and surround the upper semiconductor chip structure 178 mounted on the upper substrate 655.

Figure 20:
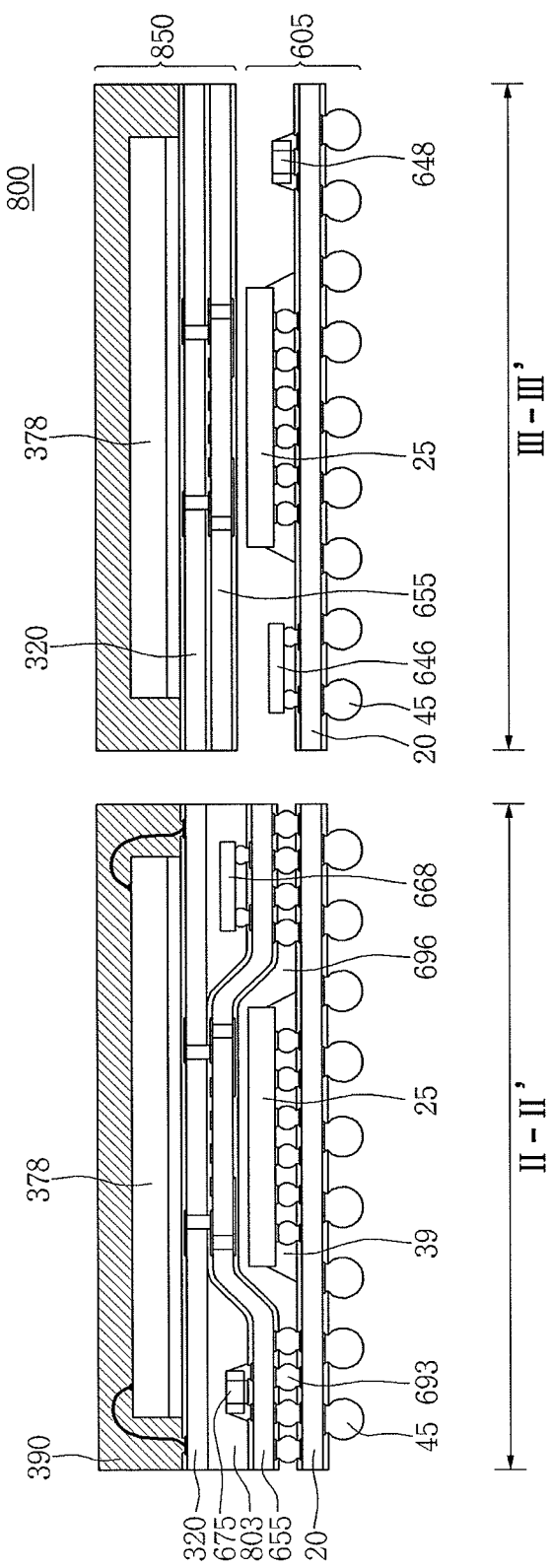
FIG. 20 illustrates cross-sectional views of a semiconductor package along lines II-IF and III-III' of FIG. 18 in accordance with another embodiment.

A semiconductor package 800 in accordance with an embodiment will be described with reference to FIG. 20. FIG. 20 is a cross-sectional view showing the semiconductor package 800 in accordance with an embodiment.

Referring to FIG. 20, the semiconductor package 800 in accordance with an embodiment may include the lower package 605, and the lower peripheral component structures 646 and 648 mounted on the lower substrate 20 of the lower package 605, which are the same as those described in FIG. 17. The semiconductor package 800 may further include an upper package 850 disposed on the lower package 605, and the package interconnection structures 693 which are interposed between the upper package 850 and the lower package 605 and electrically connect the upper package 850 to the lower package 605.

The upper package 850 may include the substrate 655 having the first part CP', the second part PP', and the third parts IP' located between the first part CP' and the second parts PP', which are the same as those described in FIGS. 16A to 16C. The upper package 850 may also include the upper peripheral component structures 668 and 675 mounted on the second parts PP' of the upper substrate 655, which are the same as those described in FIGS. 17 and 18.

The upper package 850 may further include a substrate molding layer 803 which is disposed on the second parts PP' and the third parts IP' of the upper substrate 655 and covers the upper peripheral component structures 668 and 675. The upper package 850 may include the interposer substrate 320, the upper semiconductor chip structure 378 mounted on the interposer substrate 320 in a wire bonding method, and the molding layer 390 which is disposed on the interposer substrate 320 and covers the upper semiconductor chip structure 378, which are the same as those described in FIG. 13. The interposer substrate 320 may be disposed on the first part CP' of the upper substrate 655 and the substrate molding layer 803, and may contact the first part CP' of the upper substrate 655 and the substrate molding layer 803.

Figure 21:
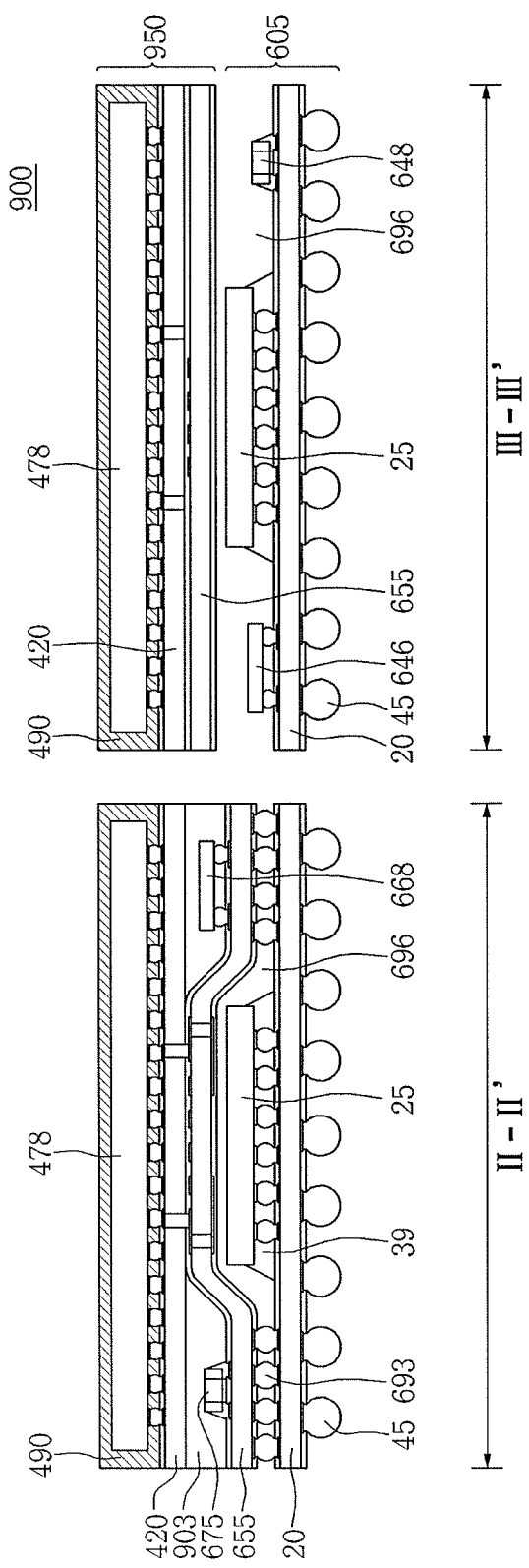
FIG. 21 illustrates cross-sectional views of a semiconductor package along lines II-IF and III-III' of FIG. 18 in accordance with another embodiment.

A semiconductor package in accordance with an embodiment will be described with reference to FIG. 21. FIG. 21 is a cross-sectional view showing a semiconductor package in accordance with an embodiment.

Referring to FIG. 21, a semiconductor package 900 in accordance with an embodiment may include the lower package 605, and the lower peripheral component structures 646 and 648 mounted on the lower substrate 20 of the lower package 605, which are the same as those described in FIG. 17. The semiconductor package 900 may further include an upper package 950 disposed on the lower package 605, and the package interconnection structures 693 which are interposed between the upper package 950 and the lower package 605 and electrically connect the upper package 950 to the lower package 605.

The upper package 950 may include the upper substrate 655 having the first part CP', the second parts PP', and the third parts IP' located between the first part CP' and the second parts PP', which are the same as those described in FIGS. 16A to 16C. The upper package 950 may also include the upper peripheral component structures 668 and 675 mounted on the second parts PP' of the upper substrate 655, which are the same as those described in FIGS. 17 and 18.

The upper package 950 may further include a substrate molding layer 903, which is disposed on the second parts PP' and the third parts IP' of the upper substrate 655 and covers the upper peripheral component structures 668 and 675. The upper package 950 may further include the interposer substrate 420, the upper semiconductor chip structure 478 mounted on the interposer substrate 420 by a flip chip bonding method, and the molding layer 490 which is disposed on the interposer substrate 420 and covers the upper semiconductor chip structure 478, which are the same as those described in FIG. 14. The interposer substrate 420 may be disposed on the first part CP' of the upper substrate 655 and the substrate molding layer 903, and may contact the first part CP' of the upper substrate 655 and the substrate molding layer 903.

Figure 22:
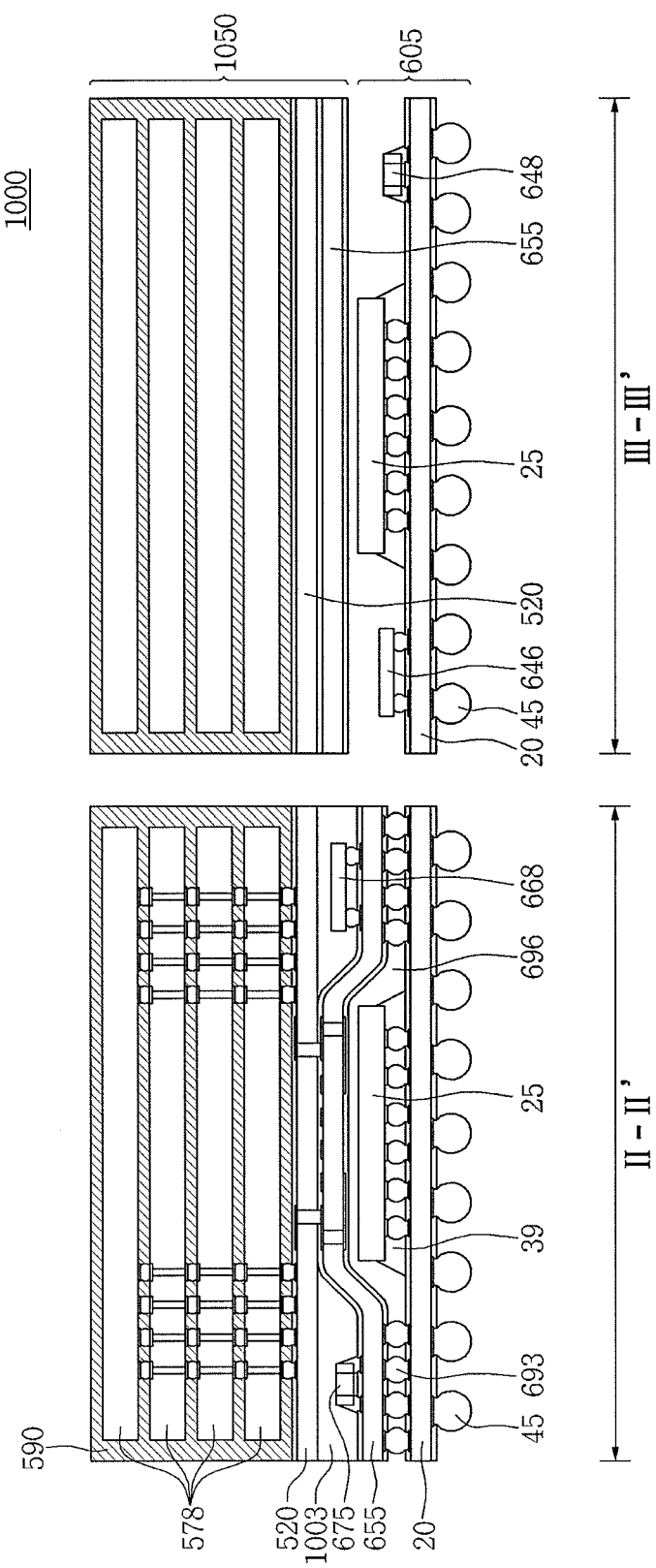
FIG. 22 illustrates cross-sectional views of a semiconductor package along lines II-II' and III-III' of FIG. 18 in accordance with another embodiment.

A semiconductor package in accordance with an embodiment will be described with reference to FIG. 22. FIG. 22 is a cross-sectional view of a semiconductor package in accordance with an embodiment.

Referring to FIG. 22, a semiconductor package 1000 in accordance with an embodiment may include the lower package 605 including the lower semiconductor chip structure 25 and the lower peripheral component structures 646 and 648, which are the same as those described in FIG. 17. The semiconductor package 1000 may further include an upper package 1050 disposed on the lower package 605, and the package interconnection structures 693 which are interposed between the upper package 1050 and the lower package 605 and electrically connect the upper package 1050 to the lower package 605.

The upper package 1050 may include the upper substrate 655 having the first part CP', the second parts PP', and the third parts IP' located between the first part CP' and the second parts PP', which are the same as those described in FIGS. 16A to 16C. The upper package 1050 may also include the upper peripheral component structures 668 and 675 mounted on the second parts PP' of the upper substrate 655, which are the same as those described in FIGS. 17 and 18.

The upper package 1050 may further include a substrate molding layer 1003 which is disposed on the second parts PP' and the third parts IP' of the upper substrate 655 and covers the upper peripheral component structures 668 and 675. The upper package 1050 may also include the interposer substrate 520, the upper semiconductor chip structure 578 mounted on the interposer substrate 520 by a flip chip bonding method, and the molding layer 590 which is disposed on the interposer substrate 520 and covers the upper semiconductor chip structure 578, which are the same as those described in FIG. 15. The interposer substrate 520 may be disposed on the first part CP' of the upper substrate 655 and the substrate molding layer 1003, and may contact the first part CP' of the upper substrate 655 and the substrate molding layer 1003.

Figure 23:
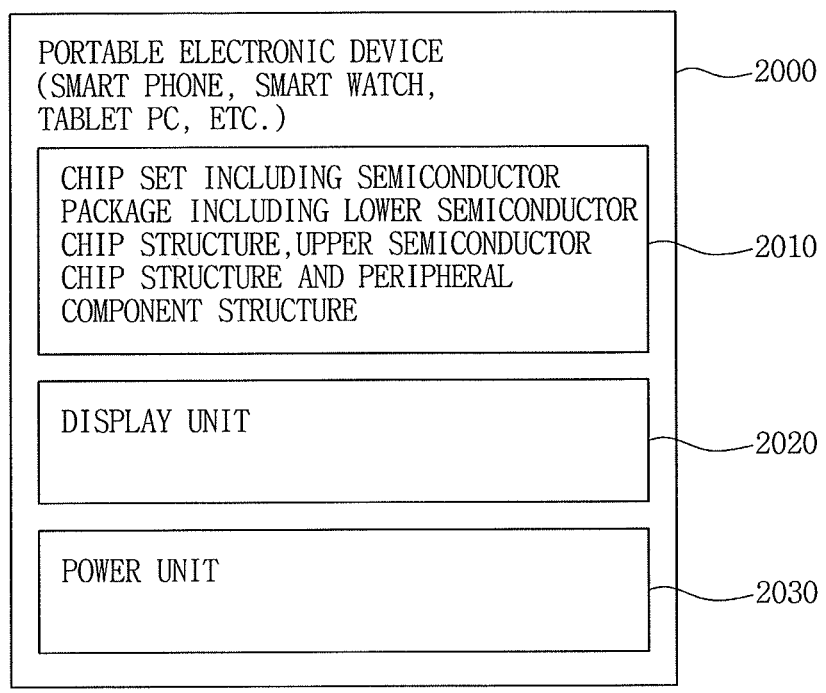
FIG. 23 illustrates a block diagram of an electronic device including a semiconductor package in accordance with an embodiment.

An electronic device including a semiconductor package in accordance with an embodiment will be described with reference to FIG. 23. FIG. 23 is a block diagram showing an electronic device including a semiconductor package in accordance with an embodiment.

Referring to FIG. 23, a portable electronic device 2000 may include a chip set 2010, a display unit 2020, and a power unit 2030. The portable electronic device 2000 may be an electronic product, e.g., a smart phone, a smart watch, a tablet PC, or the like.

The chip set 2010 may include a semiconductor package including a lower semiconductor chip structure, an upper semiconductor chip structure, and peripheral component structures. The semiconductor package may be any one of the semiconductor packages described in FIGS. 1 to 22. Therefore, the chip set 2010 may include a semiconductor package in which functionality is improved without increasing an overall thickness, and in which a data transfer rate between the lower semiconductor chip structure and the upper semiconductor chip structure is improved. The portable electronic device 2000 which uses the semiconductor package as a part thereof may be miniaturized and have high performance and high functionality, or may be designed with a smaller thickness. The power unit 2030 may include a battery capable of supplying power to the chip set 2010 and the display unit 2020.

Figure 24:
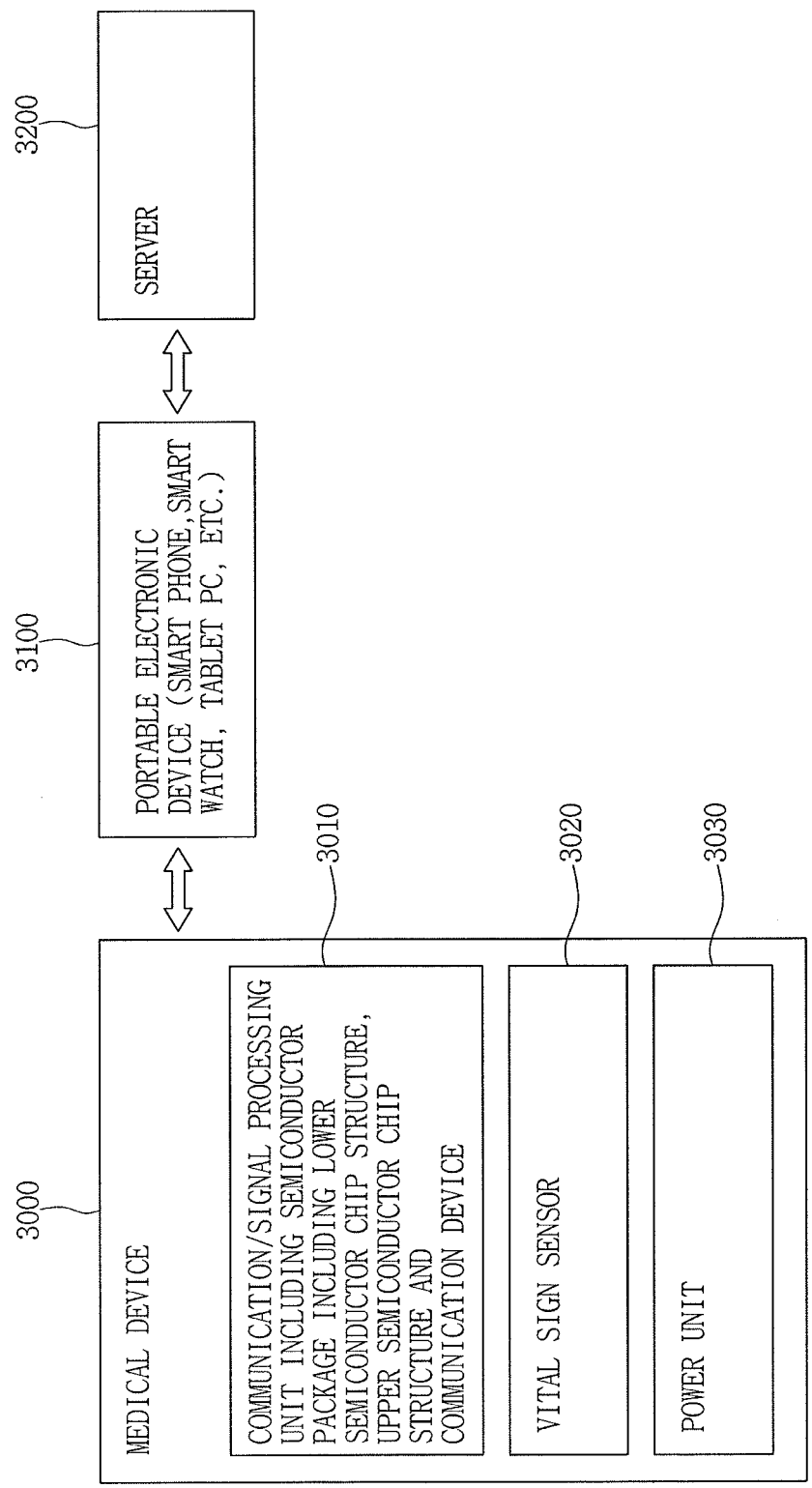
FIG. 24 illustrates a block diagram of a medical system including a semiconductor package in accordance with an embodiment.

A medical system including a semiconductor package in accordance with an embodiment will be described with reference to FIG. 24. FIG. 24 is a block diagram of a medical system including a semiconductor package in accordance with an embodiment.

Referring to FIG. 24, a medical system may include a medical device 3000, a portable electronic device 3100 capable of communicating with the medical device 3000, and a server 3200 capable of communicating with the portable electronic device 3100.

The medical device 3000 may include a communication/signal processing unit 3010, a vital sign sensor 3020, and a power unit 3030. The communication/signal processing unit 3010 may include a semiconductor package including a lower semiconductor chip structure, an upper semiconductor chip structure, and a communication device. The power unit 3030 may include a battery capable of driving the medical device 3000. The vital sign sensor 3020 may include a sensor capable of sensing a vital sign of a person. The vital sign may be a body temperature, a pulse rate, and/or a blood pressure. For example, the vital sign sensor 3020 may include a sensor capable of sensing an electrocardiogram of the person.

The semiconductor package may be any one of the semiconductor packages described in FIGS. 1 to 22. For example, the communication/signal processing unit 3010 may include the semiconductor package 1*a* described in FIG. 1. The lower semiconductor chip structure 25 of the semiconductor package 1*a* may include a logic semiconductor chip, the upper semiconductor chip structure 78 of the semiconductor package 1*a* may include a memory semiconductor chip, and the peripheral component structures 68 and 75 may include the communication device. The communication/signal processing unit 3010 may convert a sensed signal received from the vital sign sensor 3020 to patient diagnostic data, and transfer the patient diagnostic data to the portable electronic device 3100 using the communication devices of the semiconductor package 1*a*. The communication device may be a RF chip capable of wireless communication.

The portable electronic device 3100 may be an electronic device including a display unit, e.g., a smart phone, a smart watch, a tablet PC, or the like. The portable electronic device 3100 may be the portable electronic device 2000 described in FIG. 23. The portable electronic device 3100 may display the patient diagnostic data received from the medical device 3000, and thus, the user may obtain his diagnostic information.

The user may transmit the patient diagnostic data of the user to the server 3200 using the portable electronic device 3100. The server 3200 may be a server of a medical institution, e.g., a hospital, etc. A doctor of the medical institution may remotely treat the user using the patient diagnostic data of the user transferred to the server 3200.

Figure 25:
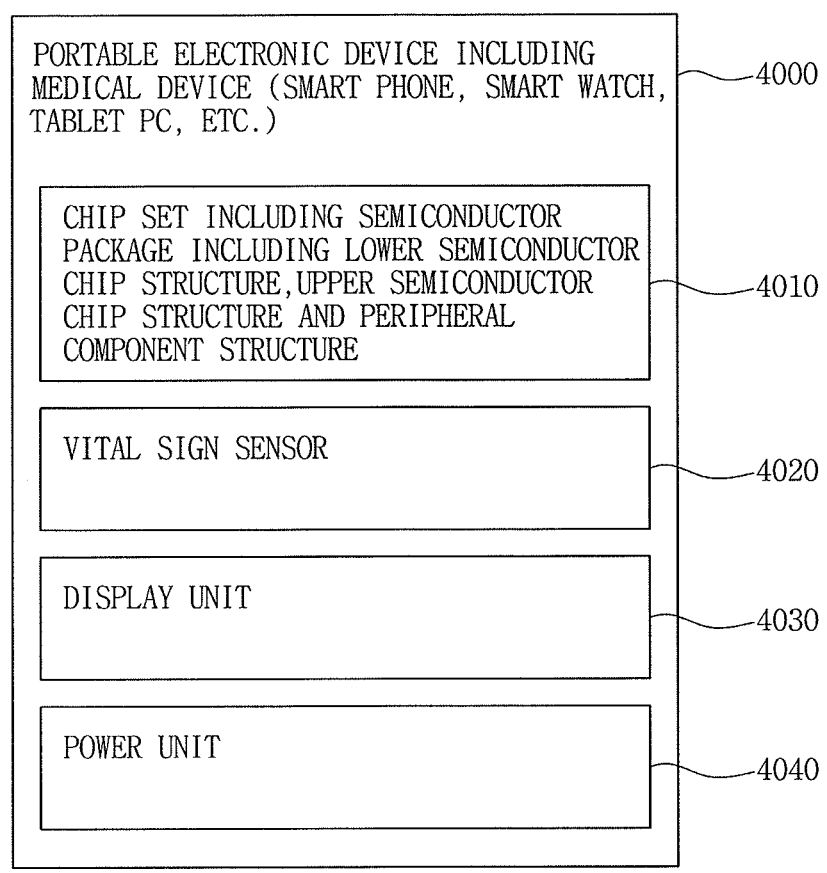
FIG. 25 illustrates a block diagram of an electronic device including a semiconductor package in accordance with an embodiment.

An electronic device including a semiconductor package in accordance with an embodiment will be described with reference to FIG. 25. FIG. 25 is a block diagram of an electronic device including a semiconductor package in accordance with an embodiment.

Referring to FIG. 25, a portable electronic device 4000 may be, e.g., a smart phone, a smart watch, a tablet PC, or the like including a medical device. The portable electronic device 4000 may include a chip set 4010, a vital sign sensor 4020, a display unit 4030, and a power unit 4040.

The vital sign sensor 4020 may sense a vital sign, e.g., a body temperature, a pulse rate, a blood pressure of the user.

The chip set 4010 may include a semiconductor package including a lower semiconductor chip structure, an upper semiconductor chip structure, and a peripheral component structure. The semiconductor package may be any one of the semiconductor packages described in FIGS. 1 to 22. The chip set 4010 may convert the sensed vital sign received from the vital sign sensor 4020 to data.

The display unit 4030 may include a touch screen. The display unit 4030 may display the vital sign. The power unit 4040 may include a battery capable of supplying power to the portable electronic device 4000.

According to an embodiment, a semiconductor package including a plurality of semiconductor chip structures is provided. The semiconductor package may include peripheral component structures without increasing a thickness. Therefore, the semiconductor package capable of embedding internal part structures can be provided without increasing the thickness while including the plurality of semiconductor chip structures.

That is, according to an embodiment, a distance between a part of an upper substrate of an upper semiconductor package and a lower substrate may be minimized, sizes of package interconnection structures interposed between the upper substrate and the lower substrate can be reduced, and the number of the package interconnection structures can be increased. As the number of the package interconnection structures is increased, a data transfer rate between the upper semiconductor chip structure of the upper semiconductor package and the lower semiconductor chip structure of the lower semiconductor package can be improved.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
a substrate having a first part, a second part, and an inclined part between the first and second parts, the first and second parts being at different height levels, and the inclined part connecting the first part to the second part, and being continuous with each of the first and second parts;
a first semiconductor chip overlapping the first part through a central part of the first semiconductor chip, and overlapping the second part and the inclined part;
an electrical interconnection structure connecting the first part of the substrate and the first semiconductor chip, a distance between the first part of the substrate and the first semiconductor chip being shorter than a distance between the second part of the substrate and the first semiconductor chip; and at least one electronic component in a space between the second part of the substrate and the first semiconductor chip.

2. The semiconductor device as claimed in claim 1, wherein a bottom surface of the first semiconductor chip overlaps a top of the at least one electronic component.

3. The semiconductor device as claimed in claim 1, wherein the first semiconductor chip extends beyond the at least one electronic component along a direction oriented from the first part of the substrate toward the second part of the substrate.

4. The semiconductor device as claimed in claim 1, wherein each of the substrate and the first semiconductor chip completely overlaps the at least one electronic component.

5. The semiconductor device as claimed in claim 1, wherein a distance between a bottom surface of the first semiconductor chip and a top surface of the second part of the substrate along a normal direction to the substrate is larger than a height of the at least one electronic component as measured from an upper surface of the substrate.

6. The semiconductor device as claimed in claim 1, wherein the at least one electronic component is electrically connected to the substrate.

7. The semiconductor device as claimed in claim 6, wherein the at least one electronic component is a passive electronic component.

8. The semiconductor device as claimed in claim 6, wherein the at least one electronic component is a driver chip or a controller chip.

9. The semiconductor device as claimed in claim 1, wherein the electrical interconnection structure is a flip-chip interconnection contacting a bottom surface of a center part of the first semiconductor chip and the first part of the substrate.

10. The semiconductor device as claimed in claim 1, further comprising a mold layer between the second part of the substrate and the first semiconductor chip, the at least one electronic component being embedded in the mold layer between the second part of the substrate and the first semiconductor chip.

11. The semiconductor device as claimed in claim 1, wherein the second part of the substrate is connected to a lower substrate with a lower semiconductor chip thereon, the lower substrate and the at least one electronic component being on opposite surfaces of the second part of the substrate.

12. The semiconductor device as claimed in claim 11, wherein:
a distance between a lower surface of the first semiconductor chip and an upper surface of the lower substrate along a normal direction to the substrate is constant, and
a distance between the first part of the substrate and the lower substrate is longer than a distance between the second part of the substrate and the lower substrate.

13. The semiconductor device as claimed in claim 1, wherein:
the second and inclined parts surround the first part, and
the space between the second part of the substrate and the first semiconductor chip surrounds the first part of the substrate.

14. The semiconductor device as claimed in claim 13, wherein the space surrounding the first part of the substrate has a constant height, a plurality of electronic components spaced apart from each other being positioned in the space around the first part.

15. A semiconductor package, comprising:
a lower semiconductor chip on a lower substrate;
an upper substrate over the lower substrate, the upper substrate having a first part, a second part, and an inclined part between the first and second parts, the first and second parts being at different height levels, and the inclined part connecting the first part to the second part, and being continuous with each of the first and second parts;
an upper semiconductor chip on the upper substrate;
a first electrical interconnection structure connecting the first part of the upper substrate and the upper semiconductor chip
a second electrical interconnection structure connecting the second part of the upper substrate to the lower substrate; and
at least one electronic component on the second part of the upper substrate,
wherein the second part of the upper substrate has an upper surface located closer to the lower substrate than an upper surface of the first part of the upper substrate,
wherein the lower semiconductor chip is between the lower substrate and the first part of the upper substrate, and
wherein the lower semiconductor chip does not overlap the second part of the upper substrate.

16. A semiconductor package, comprising:
a lower semiconductor chip on a lower substrate;
an upper substrate over the lower substrate, the upper substrate having a first part, a second part, and an inclined part between the first and second parts, the first and second parts being at different height levels, and the inclined part connecting the first part to the second part, and being continuous with each of the first and second parts;
an upper semiconductor chip overlapping the first part through a central part of the first semiconductor chip, and overlapping the second part and the inclined part;
a first electrical interconnection structure connecting the first part of the upper substrate and the upper semiconductor chip, a distance between the first part of the upper substrate and the upper semiconductor chip being shorter than a distance between the second part of the upper substrate and the upper semiconductor chip;
a second electrical interconnection structure connecting the second part of the upper substrate to the lower substrate, the upper semiconductor chip overlapping at least part of the second electrical interconnection structure; and
a space between an upper surface of the second part of the upper substrate and a bottom surface of a peripheral part of the upper semiconductor chip,
wherein the first part and the inclined part of the upper substrate define a recess relative to a bottom surface of the second part of the upper substrate, the recess facing the lower substrate, and the lower semiconductor chip extending into the recess to overlap the center of the first semiconductor chip.

17. The semiconductor package as claimed in claim 16, wherein the space has a constant height.

18. The semiconductor package as claimed in claim 17, further comprising an electronic component in the space, the electronic component being electrically connected to the upper substrate.

19. The semiconductor package as claimed in claim 15, wherein:
   the upper semiconductor chip overlaps the first part, the inclined part, and the second part of the upper substrate, and
   the at least one electronic component is between the second part of the upper substrate and the upper semiconductor chip.

* * * * *